(12) United States Patent
Maeda

(10) Patent No.: US 6,372,670 B1
(45) Date of Patent: Apr. 16, 2002

(54) METHOD AND APPARATUS FOR FORMING AN INTERLAYER INSULATING FILM, AND SEMICONDUCTOR DEVICE

(75) Inventor: Kazuo Maeda, Tokyo (JP)

(73) Assignees: Canon Sales Co., Inc.; Semiconductor Process Laboratory Co., Ltd., both of (JP)

( * ) Notice: Subject to any disclaimer, the term of this patent is extended or adjusted under 35 U.S.C. 154(b) by 0 days.

(21) Appl. No.: 09/477,352

(22) Filed: Jan. 4, 2000

(30) Foreign Application Priority Data

Mar. 24, 1999 (JP) .......................................... 11-079828

(51) Int. Cl.[7] .................. H01L 21/31; H01L 21/469
(52) U.S. Cl. .................. 438/787; 438/788; 438/627; 438/629
(58) Field of Search .................. 438/787, 788, 438/627, 629; 427/255.37, 255.393, 579

(56) References Cited

U.S. PATENT DOCUMENTS

| | | | |
|---|---|---|---|
| 5,354,715 A | 10/1994 | Wang et al. | 437/238 |
| 5,494,859 A | 2/1996 | Kapoor | 437/235 |
| 5,614,270 A | 3/1997 | Yeh et al. | 427/539 |
| 5,626,679 A | 5/1997 | Shimizu et al. | 118/723 |
| 5,660,895 A * | 8/1997 | Lee et al. | 427/579 |
| 5,830,532 A | 11/1998 | Tang et al. | 427/255 |
| 5,916,823 A * | 6/1999 | Lou et al. | 438/738 |
| 6,103,601 A * | 8/2000 | Lee et al. | 438/513 |
| 6,127,285 A * | 10/2000 | Nag | 438/788 |
| 6,184,124 B1 * | 2/2001 | Hasegawa et al. | 438/625 |

FOREIGN PATENT DOCUMENTS

| | | |
|---|---|---|
| EP | 0 935 284 | 1/1996 |
| EP | 0 849 796 | 12/1996 |
| JP | 24973 | 1/1990 |
| JP | 4139825 | 5/1992 |
| JP | 690247 | 3/1994 |
| JP | 6168930 | 6/1994 |
| JP | 6349831 | 12/1994 |
| JP | 8-20874 | 1/1996 |
| JP | 897208 | 4/1996 |
| JP | 1197533 | 4/1999 |
| JP | 118239 | 7/1999 |

OTHER PUBLICATIONS

Dultsev et al, J. Electrochem. Soc., vol. 145, No. 7, Jul. 1998, pp. 2569–2572.

* cited by examiner

*Primary Examiner*—John F. Niebling
*Assistant Examiner*—David A. Zarneke
(74) *Attorney, Agent, or Firm*—Lorusso & Loud

(57) ABSTRACT

Disclosed is a method for forming an interlayer insulating film which comprises the steps of forming an underlying insulating film on a substrate; forming a porous $SiO_2$ film on the underlying insulating film by chemical vapor deposition method using $Si_2H_6$ and an oxidative gas as a reaction gas; subjecting the porous $SiO_2$ film to H (hydrogen) plasma treatment; forming a plasma $SiO_2$ film and a fluidic $SiO_2$ film formed by $TEOS+O_3$ on the porous $SiO_2$ film; then smoothing a surface of the $SiO_2$ film by etching; and forming a cover insulating film on the smoothed surface.

8 Claims, 19 Drawing Sheets

Hydrogen Plasma Treatment

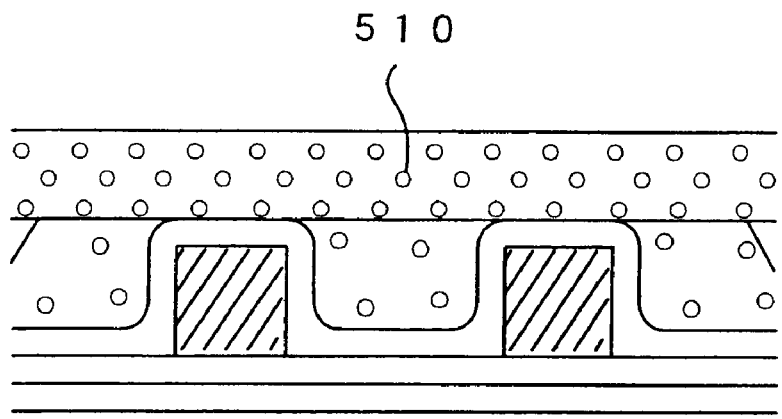
FIG. 6I
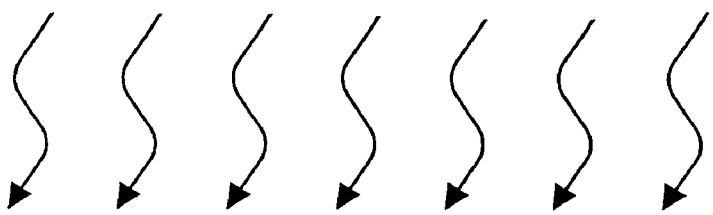
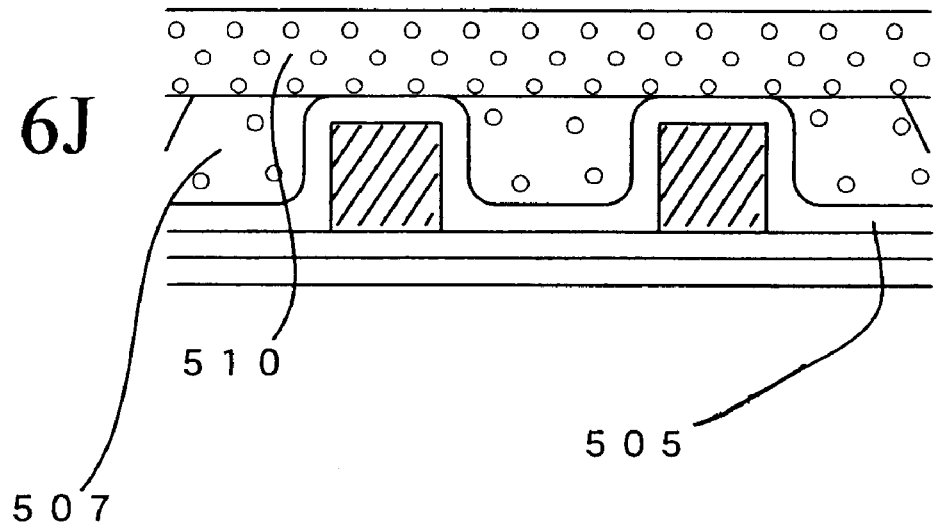
FIG. 6J

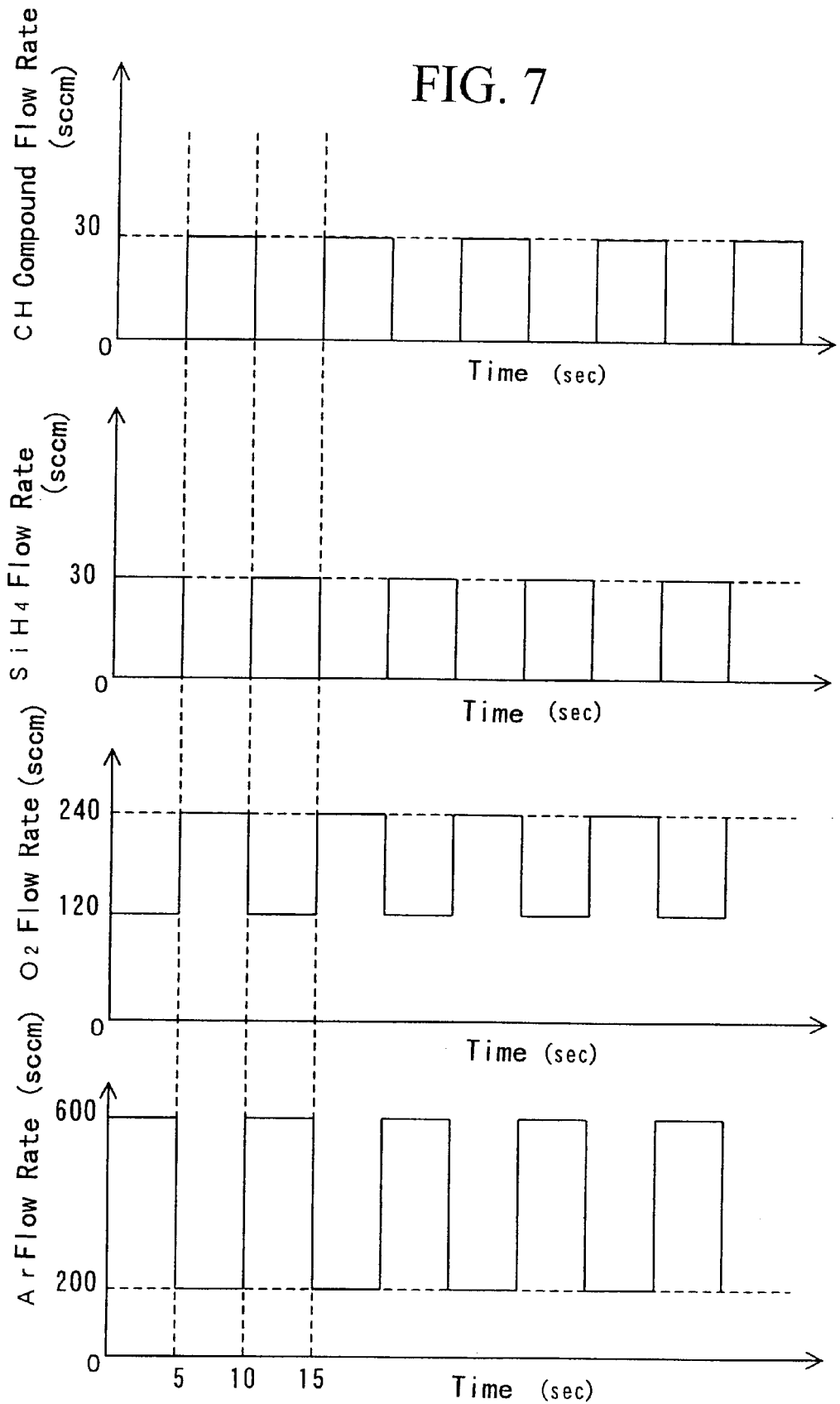

METHOD AND APPARATUS FOR FORMING AN INTERLAYER INSULATING FILM, AND SEMICONDUCTOR DEVICE

BACKGROUND OF THE INVENTION

The present invention relates to a method for forming an interlayer insulating film and, more particularly, to a method for forming an interlayer insulating film having a low dielectric constant, which is necessary for a highly-integrated semiconductor device. A progress in high integration regarding the semiconductor device in recent years has resulted in a narrower interval between wiring lines. As the narrowed interval between the wiring lines causes an increase in capacitance between the wiring lines, a request has been made for formation of an interlayer insulating film, which has a low dielectric constant.

With recent progresses in high integration of an LSI device, the wiring line has been micronized and multilayered. There has also been an increase in capacitance between the wiring lines. Such an increase in capacitance has caused a great reduction in an operating speed. Thus, improvement in this regard has been strongly demanded. As one of improvement measures, a method for reducing capacitance between the wiring lines has been studied. This method uses an interlayer insulating film, which has a dielectric constant lower than that of $SiO_2$ currently used for an interlayer insulating film.

Typical interlayer insulating films of low dielectric constants currently under study are ① an SiOF film, and ② an organic insulating film of a low dielectric constant. Description will now be made of these films.

① SiOF Film

An SiOF film is formed by using source gas containing F and substituting Si—F bond for a portion of Si—O bond in $SiO_2$. This SIOF film has a relative dielectric constant, which is monotonically reduced as concentration of F in the film increases.

For forming such SiOF films, several methods have been reported (see p.82 of monthly periodical "Semiconductor World", February issue of 1996). Most promising among these methods is one for forming an SiOF film by using $SiH_4$, $O_2$, Ar and $SiF_4$ as source gases, and by a high-density plasma enhanced CVD method (HDPCVD method). A relative dielectric constant of an SiOF film formed by this method is in a range of 3.1 to 4.0 (varies depending on F concentration in the film). This value is lower than a relative dielectric constant 4.0 of $SiO_2$, which has conventionally been used for the interlayer insulating film.

② Organic Insulating Film of Low Dielectric Constant

As an insulating film which has a lower dielectric constant (3.0 or lower) cared with the SiOF film, an organic insulating film of a low dielectric constant is now a focus of attention. Table 1 shows a few organic insulating films of low dielectric constants, which have been reported, and respective relative dielectric constants and thermal decomposition temperatures thereof.

TABLE 1

| Organic Insulating Film | Relative Dielectric Constant | Thermal Decomposition Temperature (° C.) | Note |
| --- | --- | --- | --- |
| Fluorine-containing resin | 2.4 | 420 | p. 82 of monthly periodical |
| Cytop | 2.1 | 400 | "Semiconductor World", February issue of 1997 p. 90 of monthly periodical |
| Amorphous telon | 1.9 | 400 | "Semiconductor World", February issue of 1996 p. 91 of monthly periodical "Semiconductor World", February issue of 1996 |

However, the SiLOF film is disadvantageous in that an increase in concentration of F in the film leads to a reduction in moisture absorption resistance. The reduced moisture absorption resistance poses a serious problem, because a transistor characteristic and adhesion of an upper barrier metal layer are affected.

Peeling-off easily occurs in the organic insulating film of a low dielectric constant, because of bad adhesion with a silicon wafer or the $SiO_2$ film. Furthermore, the organic insulating film is disadvantageous in that heat resistivity is low since a thermal decomposition temperature is around 400° C. The disadvantage of low heat resistivity poses a problem for annealing a wafer at a high temperature.

SUMMARY OF THE INVENTION

It is an object of the present invention to provide a method for forming an interlayer insulating film having good moisture absorption resistance and heat resistivity and a low dielectric constant, a semiconductor device using the interlayer insulating film, and a semiconductor manufacturing apparatus for forming the interlayer insulating film.

According to the method for forming the interlayer insulating film according to the present invention, an underlying insulating film is formed on an object to be formed (a substrate), and then a porous $SiO_2$ film is formed on the underlying insulating film. This porous $SiO_2$ film is formed by three following methods.

(1) Chemical vapor deposition method using $Si_2H_6$ and $O_2$ or $Si_3H_8$ and $O_2$ as a reaction gas as illustrated in FIG. 1C.

The present inventor found that this method is used whereby $Si_2H_6$ and $O_2$ or $Si_3H_8$ and $O_2$ react with each other in a vapor phase and particulate $SiO_2$ is formed in the vapor phase. Particulate $SiO_2$ is deposited on an underlying insulating film 105. The surface of underlying insulating film 105 can not be densely filled with particulate $SiO_2$ due to a shape of particulate $SiO_2$. Thus, an $SiO_2$ film 106 having many voids is formed on the underlying insulating film 105.

(2) Method in which plasma is intermittently or periodically generated in an atmosphere of $SiH_4$ and $O_2$ under a low pressure as illustrated in FIGS. 3C and 4

The present inventor found that the plasma is generated in the atmosphere of $SiH_4$ and $O_2$ under the low pressure whereby particulate $SiO_2$ is formed in the vapor phase. The surface of the substrate can not be densely filled with particulate $SiO_2$ due to the shape of particulate $SiO_2$. Thus, the particulate $SiO_2$ is deposited on the substrate, so that the porous $SiO_2$ film is formed on the substrate.

The present inventor further found that the porous $SiO_2$ film and a $SiO_2$ film formed by typical low pressure chemical vapor deposition are laminated whereby the porous $SiO_2$ film having a stable film quality is formed. The inventor invented the method in which the plasma is intermittently or periodically generated in the atmosphere of $SiH_4$ and $O_2$ under the low pressure, as the method for laminating these films. FIG. 4 shows an example of the plasma which is periodically generated. In this drawing, plasma enhanced chemical vapor deposition method is performed under the low pressure during a time period from T1 to T2. The low pressure chemical vapor deposition method is performed during the time period from T2 to T3.

(3) Method in which an organic film and the $SiO_2$ film are alternately laminated and then the film is subjected to O (oxygen) plasma treatment as illustrated in FIGS. 6C and 6D According to this method, a film 506 having the organic film and the $SiO_2$ film, these films being alternately laminated, is first formed. Then, the film 506 is subjected to the O (oxygen) plasma treatment. The O (oxygen) plasma treatment is thus performed, whereby the organic film previously formed is selectively removed and thus the voids are created in an area in the film in which the organic film is formed. Thus, $SiO_2$ alone remains in the film and many voids are created. That is, a porous $SiO_2$ film 507 is formed.

(4) H (hydrogen) plasma treatment for the porous $SiO_2$ film

The porous $SiO_2$ film formed as described above has many voids in the film. Thus, a surface area of the porous $SiO_2$ film is larger than the surface area of the $SiO_2$ film having no void. Thus, the porous $SiO_2$ film is prone to adsorb moisture in the air. As illustrated in FIGS. 1D, 3D and 6E, the porous $SiO_2$ film is subjected to the H (hydrogen) plasma treatment. Thus, a dangling bond in an Si—O bond on the inner surface of the voids is replaced by an Si—H bond. Consequently, it is possible to prevent the moisture from being adsorbed on the inner surface of the voids.

(5) Formation of a cover insulating film

As illustrated in FIG. 1E, the porous $SiO_2$ film is subjected to the H (hydrogen) plasma treatment, and then the porous $SiO_2$ film is covered with a cover insulating film 109. Thus, it is possible to further prevent the moisture from being adsorbed on the surface of the porous $SiO_2$ film 106.

Moreover, as illustrated in FIG. 8, the semiconductor manufacturing apparatus according to the present invention has control means for controlling flow rate control means for controlling a flow rate of the reaction gas and switching means for switching a high-frequency power applied to a chamber.

As illustrated in FIG. 4, this control means can alternately repeat the plasma enhanced chemical vapor deposition under the low pressure and the low pressure chemical vapor deposition in one chamber under the low pressure. That is, in FIG. 10, during the time period from T1 to T2, the reaction gases ($SiH_4$, $O_2$ and Ar) are introduced into the c and the high-frequency power is applied to the chamber, so that the plasma enhanced chemical vapor deposition under the low pressure is performed. During the time period from T2 to T3, the reaction gases ($SiH_4$, $O_2$ and Ar) are introduced into the chamber which the high-frequency power is not applied to, so that the low pressure chemical vapor deposition is performed.

Furthermore, as illustrated in FIG. 7, this control means can alternately repeat a process for forming the organic film by using the plasma enhanced chemical vapor deposition method and a process for forming the $SiO_2$ film by using the plasma enhanced chemical vapor deposition method in one chamber which the high-frequency power is applied to. That is, in FIG. 7, during the time period from T1 to T2, the reaction gas (a CH compound) for forming the organic film is introduced into the chamber which the high-frequency power is applied to, so that the organic film is formed. During the time period from T2 to T3, the reaction gases ($SiH_4$ and $O_2$) for forming the $SiO_2$ film are introduced into the chamber which the high-frequency power is applied to, so that the $SiO_2$ film is formed.

BRIEF DESCRIPTION OF THE DRAWINGS

FIGS. 6A to 6J are cross-sectional views showing the method for forming the interlayer insulating film according to a fifth embodiment of the present invention;

FIG. 7 shows the characteristics of the time dependency of the flow rate of a reaction gas (a CH compound) for forming an organic film and the flow rate of a reaction gas ($SiH_4+O_2$) for forming an $SiO_2$ film in the method for forming the interlayer insulating film according to the fifth embodiment of the present invention and the semiconductor manufacturing apparatus according to the sixth embodiment of the present invention.

DESCRIPTION OF THE PREFERRED EMBODIMENTS

Next, embodiments of the present invention will be described with reference to the accompanying drawings.

(1) Description of methods for forming an interlayer insulating film according to the embodiments of the present invention (a) First embodiment FIGS. 1A to 1H are cross sectional views for describing the first embodiment.

Figure 1A:
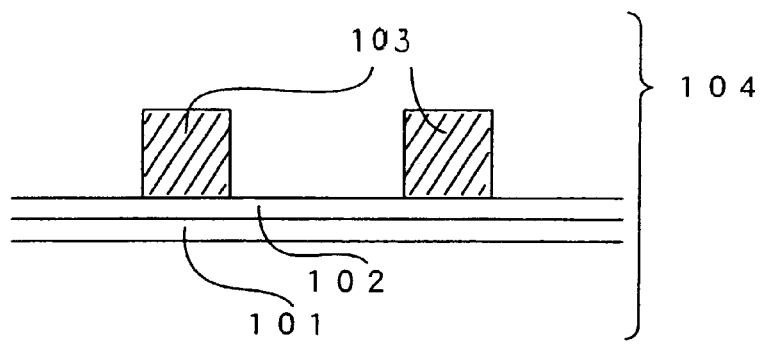
FIGS. 1A to 1H are cross-sectional views showing a method for forming an interlayer insulating film according to a first embodiment of the present invention.

First, as shown in FIG. 1A, a BPSG (borophosphosilicate glass) film 102 is formed on a silicon substrate 101. Then, an aluminum film is formed on the BPSG film 102 and then the aluminum film is patterned, whereby an aluminum wiring layer 103 is formed. A substrate 104 comprises the silicon substrate 101, the BPSG film 102 and the aluminum wiring layer 103.

Figure 1B:
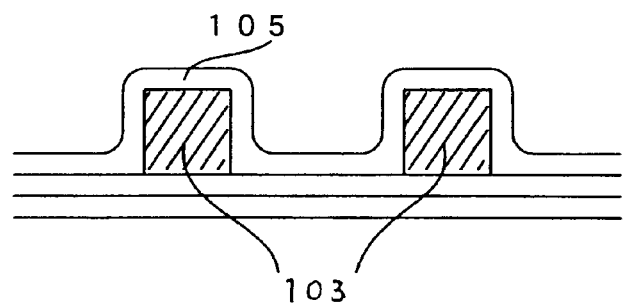

Next, as shown in FIG. 1B, an $SiO_2$ film 105 (an underlying insulating film) is formed on the substrate 104. This $SiO_2$ film 105 is formed by a plasma enhanced CVD method (plasma enhanced Chemical Vapor Deposition method). $SiH_4$ and $N_2O$ are used as a reaction gas. A thickness of the $SiO_2$ film 105 is 100 nm.

Figure 1C:
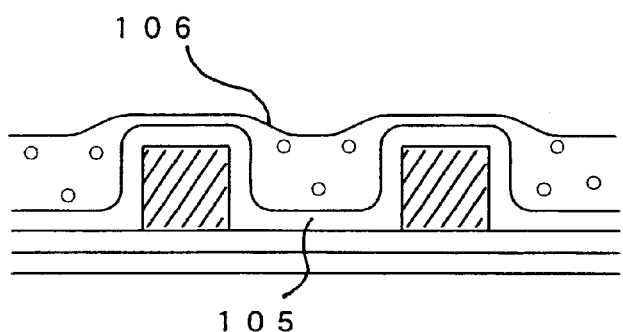

Subsequently, as shown in FIG. 1C, an $SiO_2$ film 106 is formed on the $SiO_2$ film 105. This $SiO_2$ film 106 is formed by CVD (Chemical Vapor Deposition) using $Si_2H_6$ and $O_3$ as the reaction gas. When these reaction gases are used, $SiO_2$ having large particles is formed in a vapor phase and $SiO_2$ having large particles is deposited on the $SiO_2$ film 105. Thus, the $SiO_2$ film 106 has many voids in the film. Consequently, the $SiO_2$ film 106 is a porous $SiO_2$ film. The thickness of the porous $SiO_2$ film 106 is 500 nm.

Figure 1D:
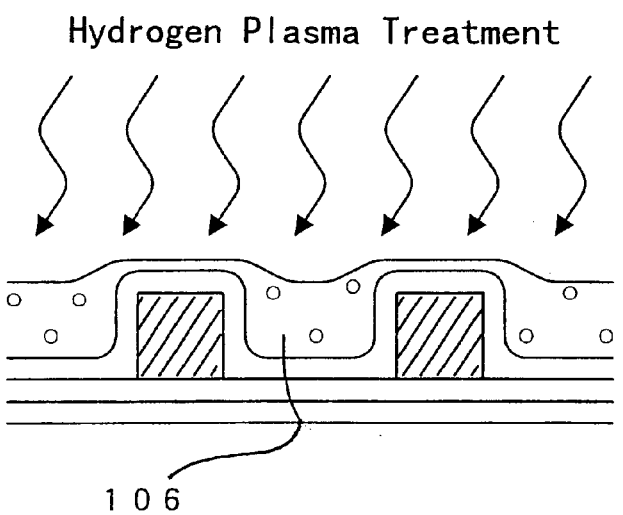

Next, as shown in FIG. 1D, the porous $SiO_2$ film 106 is subjected to H (hydrogen) plasma treatment. Thus, a dangling bond in an Si—O bond on the inner surface of the voids is replaced by an Si—H bond. As a result, the film improves in moisture absorption resistance.

Figure 1E:
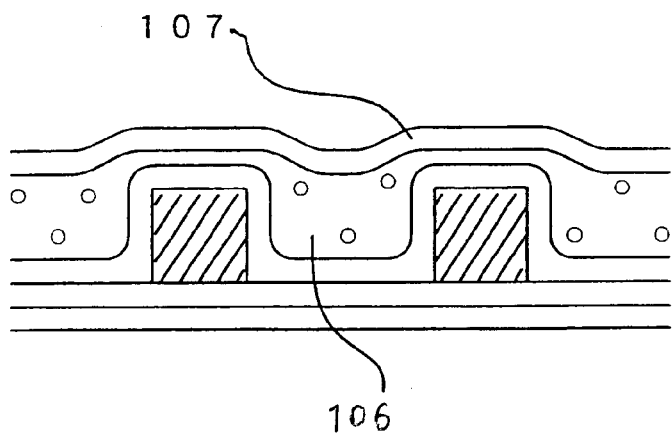

Subsequently, as shown in FIG. 1E, an $SiO_2$ film 107 is formed on the porous $SiO_2$ film 106 subjected to the H (hydrogen) plasma treatment. This $SiO_2$ film 107 is formed by the plasma enhanced CVD method. $SiH_4$ and $N_2O$ are used as the reaction gas.

Figure 1F:
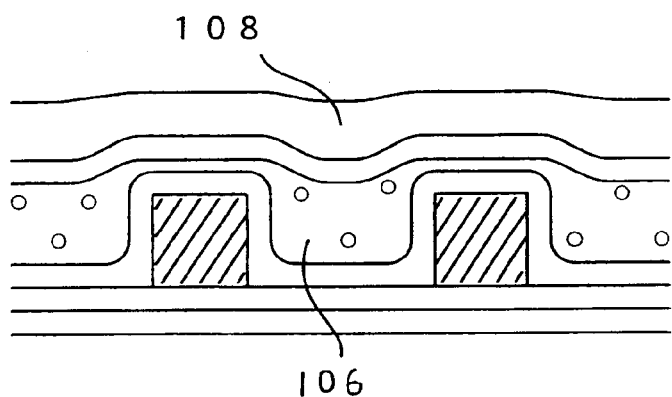

Next, as shown in FIG. 1F, an $SiO_2$ film 108 is formed on the $SiO_2$ film 107. This $SiO_2$ film 108 is formed in order to planarize the surface. The $SiO_2$ film 108 is formed by the CVD method using TEOS (Tetra-Ethyl-Ortho-Silicate) and O3 as the reaction gas. A density of $O_3$ for use in this case is the density enough to oxidize TEOS. Thus, the $SiO_2$ film 108 is a fluidic $SiO_2$ film. The thickness of the $SiO_2$ film 108 is 200 nm.

Figure 1G:
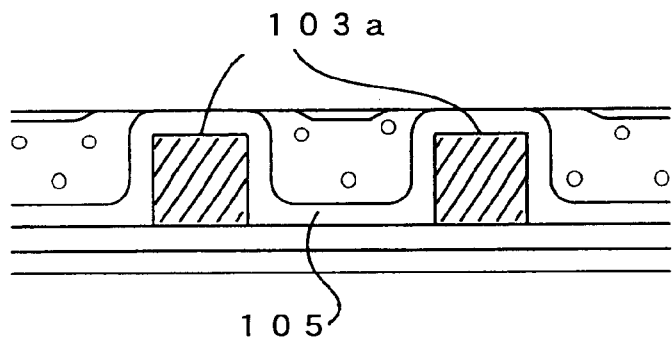

Subsequently, as shown in FIG. 1G, the surface of the $SiO_2$ film 108 is planarized by etching or CMP method (Chemical Mechanical Polishing method). At this time, the respective $SiO_2$ films 105, 106 and 107 previously formed are partly removed by the etching. The planarizing by the etching is such that the $SiO_2$ film 105 formed on a convexity 103a of the aluminum wiring layer is not completely removed.

Figure 1H:
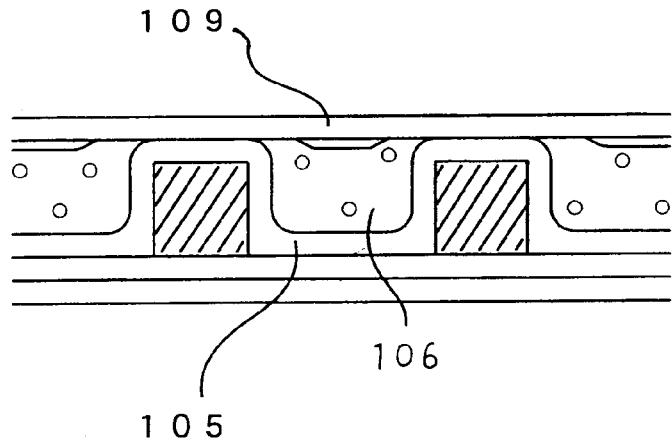

Subsequently, as shown in FIG. 1H, an $SiO_2$ film 109 (a cover insulating film) is formed on the planarized surface. This $SiO_2$ film 109 is formed by the plasma enhanced CVD method. SiH4 and $N_2O$ are used as the reaction gas. The thickness of the $SiO_2$ film 109 is 100 nm.

The interlayer insulating film having good heat proof and moisture absorption resistance and a low dielectric constant is formed on the substrate 104 by the $SiO_2$ films 105 (the underlying insulating film), 106, 107 and 109 (the cover insulating film) which are formed as described above. That is, the $SiO_2$ film 106 is porous and thus the dielectric constant of the $SiO_2$ film 106 is 2.0 to 3.0. These values are lower than the dielectric constant 4.0 of a typical $SiO_2$ film. Moreover, the typical $SiO_2$ film 109 is formed on the porous $SiO_2$ film 106. Thus, it is possible to prevent moisture from penetrating into the $SiO_2$ film 106. Furthermore, the heat proof of the $SiO_2$ films 105, 106, 107 and 109 is better than that of an organic insulating film.

In the above-described example, $Si_2H_6$ and $O_3$ are used as the reaction gas in order to form the porous $SiO_2$ film 106. However, other reaction gases can be used to form the similar porous $SiO_2$ film to the above-exemplified porous $SiO_2$ film. Such reaction gases are as follows:

$Si_2H_6+O_2$,

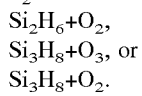$Si_3H_8+O_3$, or $Si_3H_8+O_2$.

Furthermore, a B-containing reaction gas and an F-containing reaction gas are used in addition to the above-mentioned reaction gases, whereby a porous B-containing $SiO_2$ film and a porous F-containing $SiO_2$ film can be formed.

(b) Second embodiment

The second embodiment is obtained by applying the first embodiment to a damascene process.

FIGS. 2A to 2M are cross sectional views for describing the second embodiment.

Figure 2A:
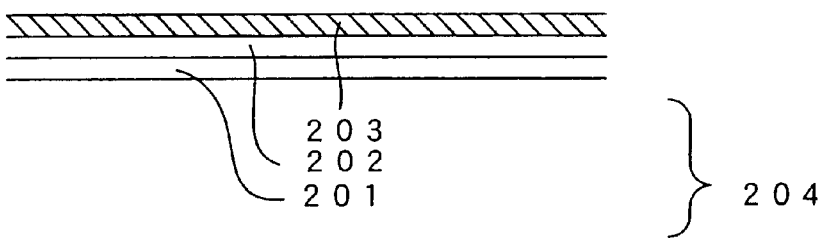
FIGS. 2A to 2M are cross-sectional views showing the method for forming the interlayer insulating film according to a second embodiment of the present invention.

First, as shown in FIG. 2A, a BPSG (borophosphosilicate glass) film 202 is formed on a silicon substrate 201. An aluminum layer is formed on the BPSG film 202 and then the aluminum layer is patterned, whereby an aluminum wiring layer 203 is formed. A substrate 204 comprises the silicon substrate 201, the BPSG film 202 and the aluminum wiring layer 203.

Figure 2B:
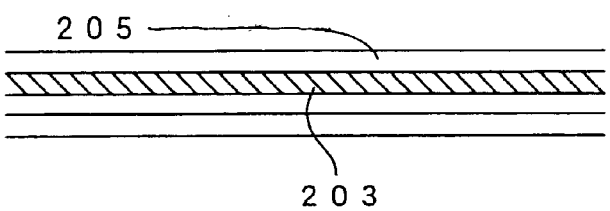

Subsequently, as shown in FIG. 2B, an $SiO_2$ film 205 (the underlying insulating film) having a thickness of 100 nm is formed on the aluminum wiring layer 203. This $SiO_2$ film 205 is formed by the plasma enhanced CVD method. $SiH_4$ and $N_2O$ are used as the reaction gas.

Figure 2C:
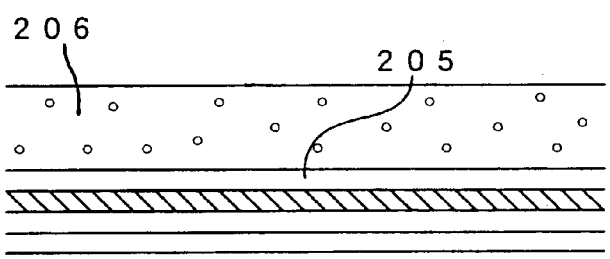

Then, as shown in FIG. 2C, an $SiO_2$ film 206 is formed on the $SiO_2$ film 205 (the underlying insulating film). This $SiO_2$ film 206 is formed by the CVD method using $Si_2H_6$ and $O_3$ as the reaction gas. When these reaction gases are used, particulate $SiO_2$ is formed in the vapor phase and the particulate $SiO_2$ is deposited on the $SiO_2$ film 205. Thus, the $SiO_2$ film 206 has many voids in the film. Consequently, the $SiO_2$ film 206 is a porous $SiO_2$ film. The thickness of the porous $SiO_2$ film 206 is 500 nm.

Figure 2D:
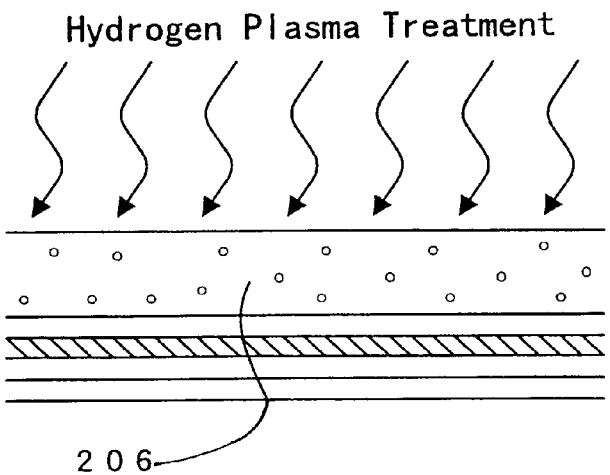

Next, as shown in FIG. 2D, the porous $SiO_2$ film 206 is subjected to the H (hydrogen) plasma treatment. Thus, the dangling bond in the Si—O bond on the inner surface of the voids is replaced by the Si—H bond. Therefore, the film improves in the moisture absorption resistance.

Figure 2E:
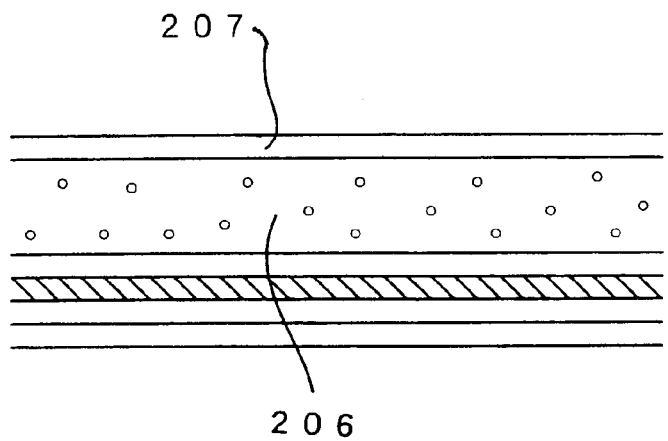

Next, as shown in FIG. 2E, an $SiO_2$ film 207 is formed on the porous $SiO_2$ film 206. This $SiO_2$ film 207 is formed by the plasma enhanced CVD. $SiH_4$ and $N_2O$ are used as the reaction gas. The $SiO_2$ film 207 can prevent Cu of a Cu-plated film to be later formed on the $SiO_2$ film 207 from diffusing into the porous $SiO_2$ film 206.

Figure 2F:
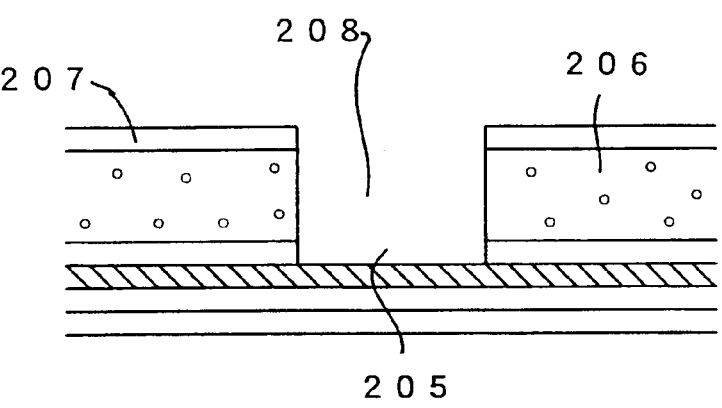

Subsequently, as shown in FIG. 2F, the $SiO_2$ films 205 (the underlying insulating film), 206 and 207 are opened by patterning, whereby a damascene trench 208 is formed. This damascene trench 208 communicates with the aluminum wiring layer 203 formed under the $SiO_2$ film 205.

Figure 2G:
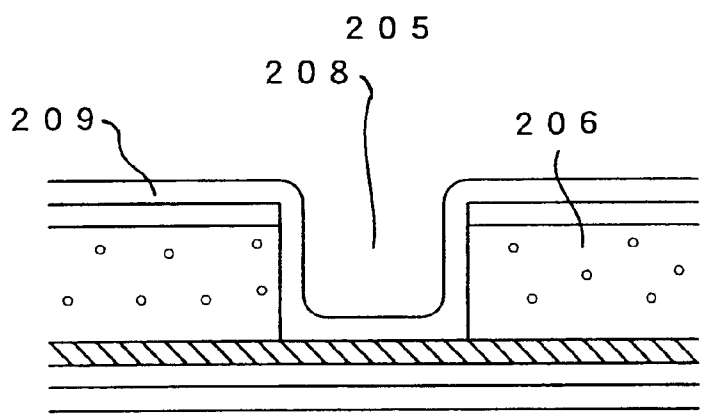

Next, as shown in FIG. 2G, an $SiO_2$ film 209 (a first insulating film) is formed on the $SiO_2$ film 207 and on sides and a bottom of the damascene trench 208. This $SiO_2$ film 209 is formed by the plasma enhanced CVD method. The $SiO_2$ film 209 formed on the sides of the damascene trench 208 can prevent Cu to be later buried in the damascene trench 208 from diffusing into the porous $SiO_2$ film 206.

Figure 2H:
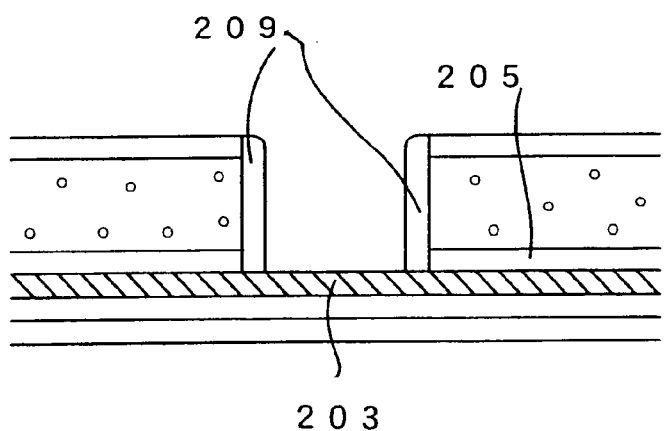

Next, as shown in FIG. 2H, the $SiO_2$ film 209 (the first insulating film) is anisotropically etched. Thus, the $SiO_2$ film 209 is removed leaving a portion of the $SiO_2$ film 209 formed on the sides of the damascene trench 208. Consequently, a contact hole communicating with the aluminum wiring layer 203 is formed in the bottom of the damascene trench 208. The $SiO_2$ film 207 remains on the porous $SiO_2$ film 206 without being removed by this etching.

Figure 2I:
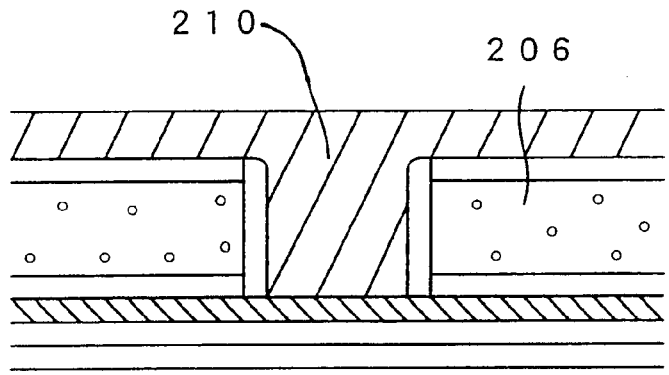

Subsequently, as shown in FIG. 2I, a Cu-plated film 210 is formed in the damascene trench 208 and on the $SiO_2$ film 207. The Cu-plated film 210 formed in the damascene trench 208 is used as Cu wiring layer.

Figure 2J:
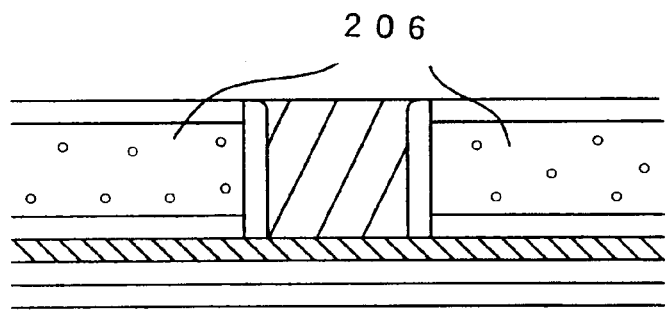

Next, as shown in FIG. 2J, the Cu-plated film 210 formed on the $SiO_2$ film 207 is polished and removed by the CMP method. Thus, the Cu-plated film remains only in the damascene trench 208.

Figure 2K:
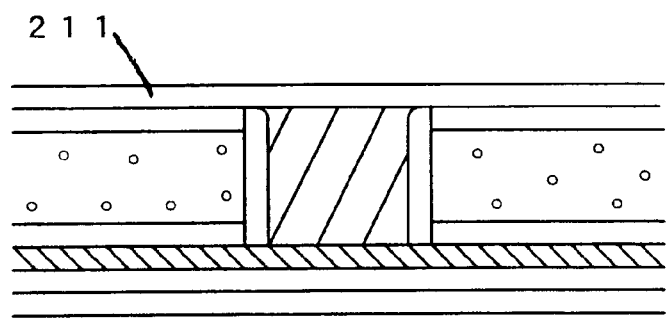

Subsequently, as shown in FIG. 2K, a TiN film 211 for a barrier metal is formed on the damascene trench 208. This TiN film 211 can prevent Cu in the damascene trench 208 from diffusing into the $SiO_2$ film to be later formed on the damascene trench 208.

Figure 2L:
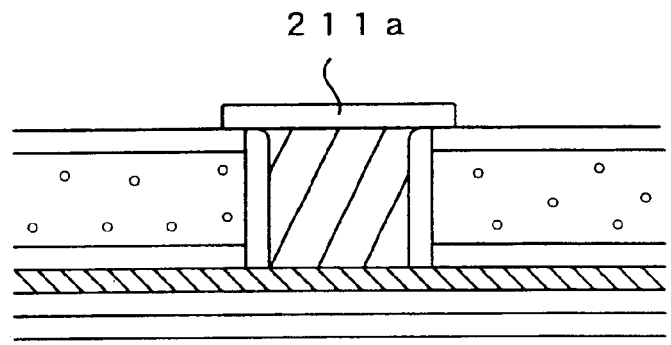

Next, as shown in FIG. 2L, the patterning leaves a TiN film 211a formed on the damascene trench 208 and etches away the TiN film 211 formed on the other portion.

Figure 2M:
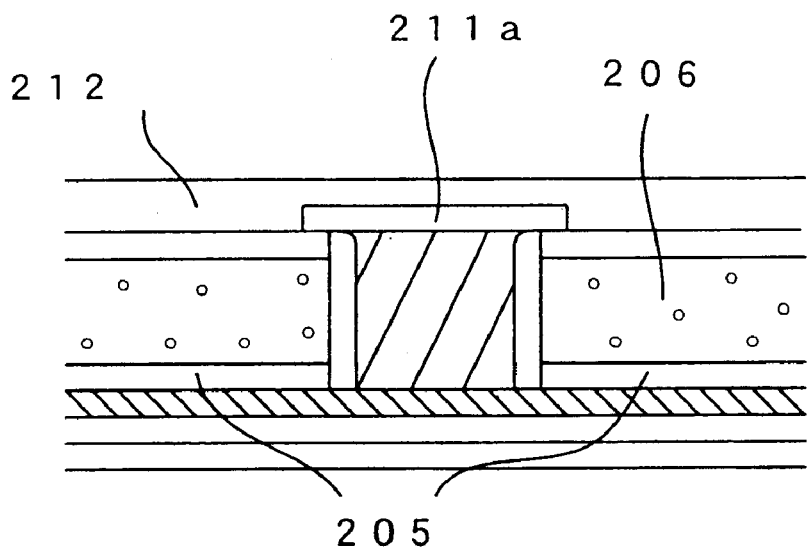

Subsequently, as shown in FIG. 2M, an $SiO_2$ film 212 (the cover insulating film) is formed on the $SiO_2$ film 207 and the TiN film 211a. This $SiO_2$ film 212 is formed by the plasma enhanced CVD method. $SiH_4$ and $N_2O$ are used as the reaction gas.

As described above, the interlayer insulating film having the good heat resistivity and moisture absorption resistance and the low dielectric constant is formed on the substrate 204. That is, the $SiO_2$ film 206 is porous and thus the dielectric constant of the $SiO_2$ film 206 is 2.0 to 3.0. These values are lower than the dielectric constant 4.0 of a typical nonporous $SiO_2$ film. Moreover, the typical $SiO_2$ films 207 and 212 (the cover insulating film) are formed on the porous $SiO_2$ film 206. Thus, it is possible to prevent the moisture from penetrating into the porous $SiO_2$ film 206. Furthermore, the heat resistivity of the $SiO_2$ films 206, 207 and 212 is better than that of the organic insulating film.

In the above-described example, $Si_2H_6$ and $O_3$ are used as the reaction gas in order to form the porous $SiO_2$ film 206. However, other reaction gases can be used to form the similar porous $SiO_2$ film to the above-exemplified porous $SiO_2$ film. Such reaction gases are as follows:

$Si_2H_6+O_2$, $Si_3H_8+O_3$, or $Si_3H_8+O_2$.

Furthermore, the B-containing reaction gas and the F-containing reaction gas are used in addition to the above-mentioned reaction gases, whereby the porous B-containing $SiO_2$ film and the porous F-containing $SiO_2$ film can be formed.

(c) Third embodiment

FIGS. 3A to 3I are cross-sectional views for describing the third embodiment. FIG. 4 is a graph showing time dependency of an $SiH_4$ flow rate, an $O_2$ flow rate, an Ar flow rate and an RF power applied to a chamber in the third embodiment.

Figure 3A:
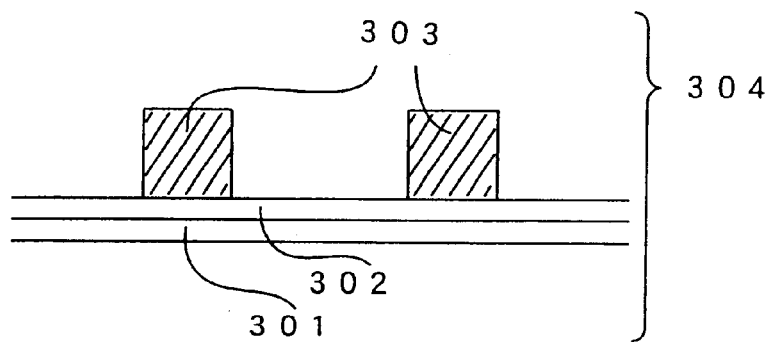
FIGS. 3A to 3I are cross-sectional views showing the method for forming the interlayer insulating film according to a third embodiment of the present invention.
Figure 4:
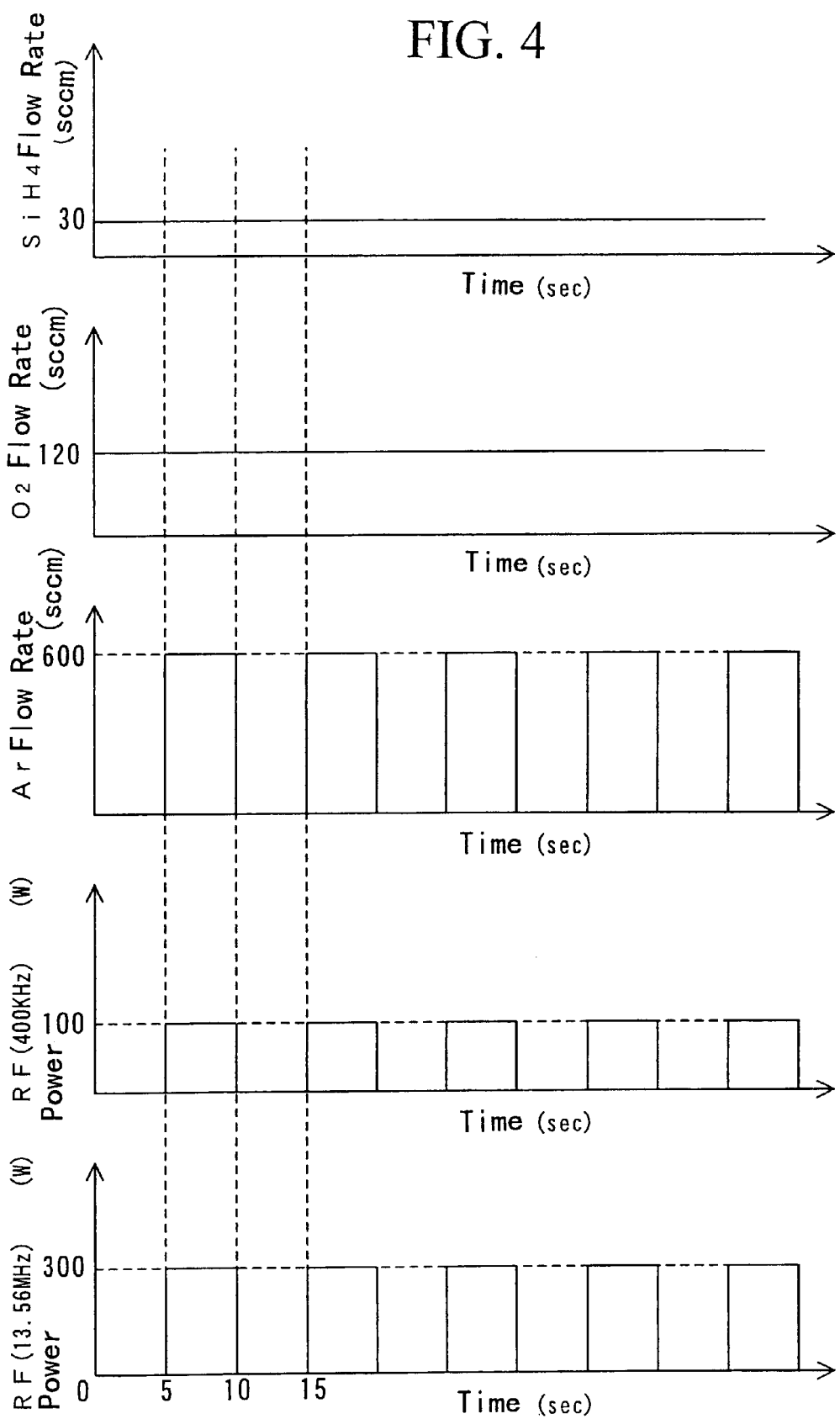
FIG. 4 shows characteristics of time dependency of an SiH4 flow rate, an $O_2$ flow rate, an Ar flow rate and an RF power applied to a chamber in the method for forming the interlayer insulating film according to the third and fourth embodiments of the present invention and a semiconductor manufacturing apparatus according to a sixth embodiment of the present invention.

First, as shown in FIG. 3A, a BPSG (borophosphosilicate glass) film 302 is formed on a silicon substrate 301. The aluminum layer is formed on the BPSG film 302 and then the aluminum layer is patterned, whereby an aluminum wiring layer 303 is formed. A substrate 304 comprises the silicon substrate 301, the BPSG film 302 and the aluminum wiring layer 303.

Figure 3B:
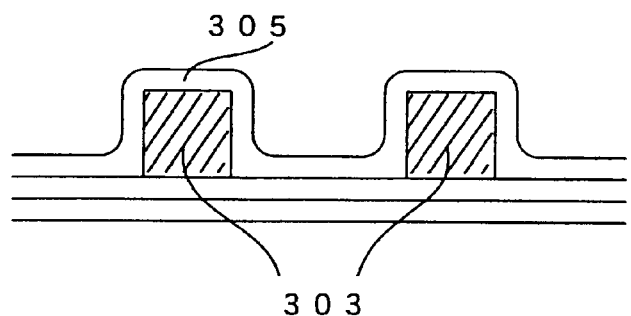

Then, as shown in FIG. 3B, an $SiO_2$ film 305 (the underlying insulating film) of 100 nm in thickness is formed on the aluminum wiring layer 303. This $SiO_2$ film 305 is formed by low pressure CVD method using $SiH_4$ and $O_2$ as the reaction gas under a pressure of 1 Torr with the silicon substrate 301 kept at 400° C.

Figure 3C:
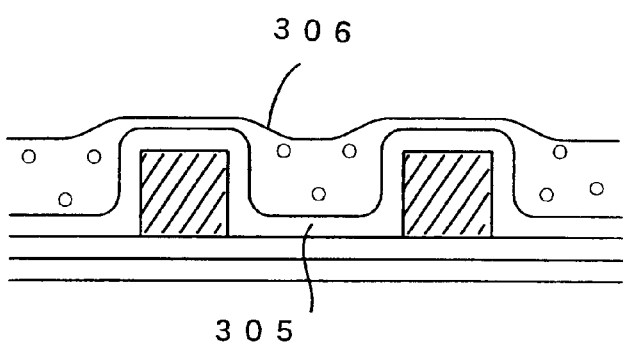

Subsequently, as shown in FIG. 3C, a porous $SiO_2$ film 306 is formed on the $SiO_2$ film 305 (the underlying insulating film). This $SiO_2$ film 306 is formed by applying the RF power shown in FIG. 4 to the chamber using $SiH_4$ and $O_2$ as the reaction gas with the silicon substrate 301 kept at 400° C. As can be seen from FIG. 4, during film formation, the 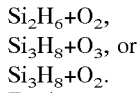 $SiH_4$ flow rate and the $O_2$ flow rate are fixed, whereas the RF power is applied to the chamber at a cycle of 10 sec. Thus, plasma is generated and disappears at every cycle of 10 sec. While the plasma is generated, Ar is introduced into the chamber in order to control the pressure in the chamber. The use of the plasma changing with time allows the process using the low pressure CVD and the process using the plasma enhanced CVD under a low pressure to repeat in one chamber. For example, in FIG. 4, the plasma is not generated during a time period from 0 sec to 5 sec, and thus the process using the low pressure CVD is performed. The plasma is generated during the time period from 5 sec to 10 sec, and thus the process using the plasma enhanced CVD under the low pressure is performed. In this embodiment, the pressure in the chamber during the low pressure CVD is 1.0 Torr. This pressure is lower than the pressure (2.0 Torr) in the chamber during the plasma enhanced CVD under the low pressure. Moreover, the RF power with a frequency of 13.56 MHz and the RF power with a frequency of 400 kHz are used in order to generate the plasma. The low pressure CVD and the plasma enhanced CVD under the low pressure are repeated in this manner, whereby the $SiO_2$ film having many voids is formed. That is, the $SiO_2$ film 306 is porous.

Figure 3D:
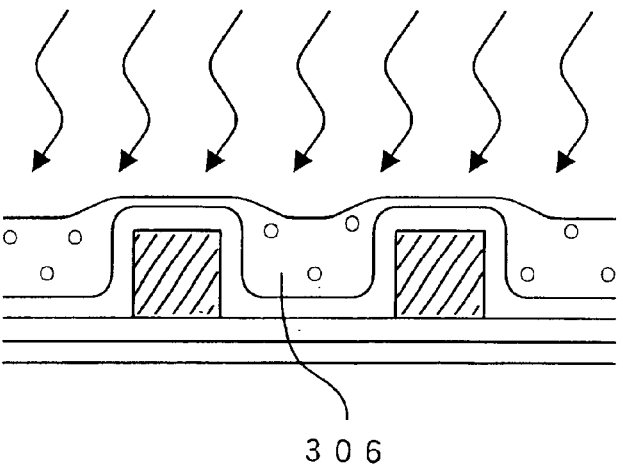

Next, as shown in FIG. 3D, the porous $SiO_2$ film 306 is subjected to the H (hydrogen) plasma treatment. Thus, the dangling bond in the Si—O bond on the inner surface of the voids is replaced by the Si—H bond. Accordingly, the film improves in the moisture absorption resistance.

Figure 3E:
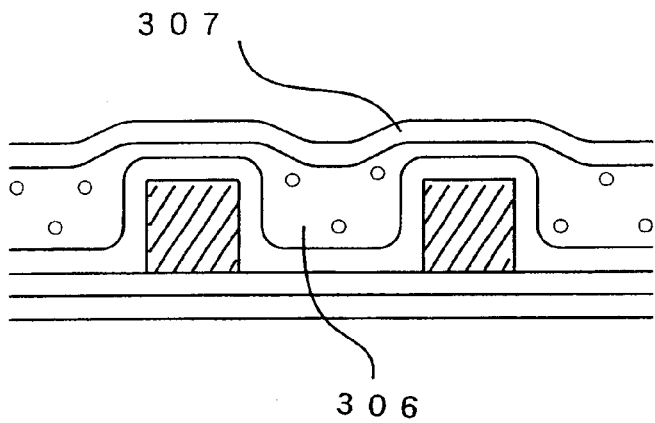

Then, as shown in FIG. 3E, an $SiO_2$ film 307 is formed on the porous $SiO_2$ film 306 subjected to the H (hydrogen) plasma treatment. This $SiO_2$ film 307 is formed by the low pressure CVD method. $SiH_4$ and $O_2$ are used as the reaction gas.

Figure 3F:
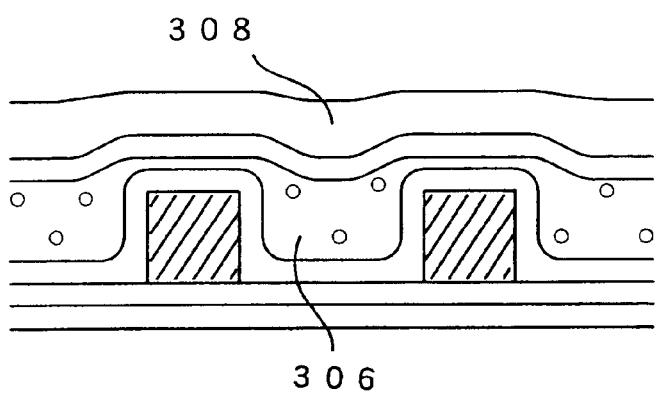

Next, as shown in FIG. 3F, an $SiO_2$ film 308 is formed on the $SiO_2$ film 307. This $SiO_2$ film 308 is formed in order to planarize the surface. The $SiO_2$ film 308 is formed by the CVD method using TEOS (Tetra-Ethyl-Ortho-Silicate) and $O_3$ as the reaction gas. The density of $O_3$ for use in this case is enough to oxidize TEOS. Thus, the $SiO_2$ film 308 is a fluidic $SiO_2$ film.

Figure 3G:
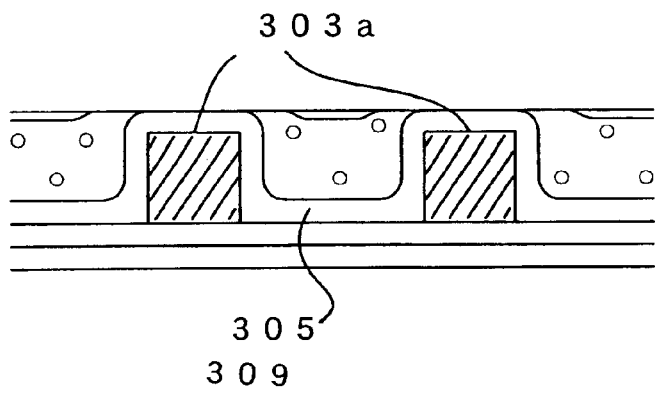

Subsequently, as shown in FIG. 3G, the surface of the $SiO_2$ film 308 is polished and planarized by the CMP method (Chemical Mechanical Polishing method). At this time, the respective $SiO_2$ films 305, 306 and 307 previously formed are partly polished and removed. The planarizing by the CMP method is such that the $SiO_2$ film 305 formed on a convexity 303a of the aluminum wiring layer is not completely removed.

Figure 3H:
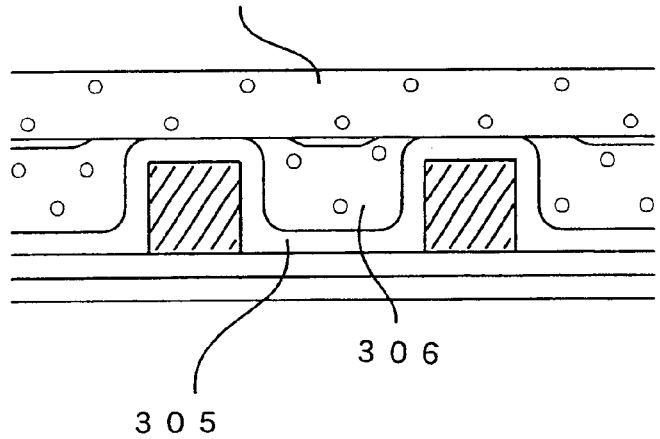

Next, as shown in FIG. 3H, a porous $SiO_2$ film 309 is formed on the planarized surface. This $SiO_2$ film 309 is formed by repeating the low pressure CVD and the plasma enhanced CVD similarly to the porous $SiO_2$ film 306 previously formed. That is, the $SiO_2$ film 309 is formed by using pulse plasma shown in FIG. 10 in an atmosphere of Ar using $SiH_4$ and $O_2$ as the reaction gas with the silicon substrate 301 kept at 400° C. The pressure in the chamber during the low pressure CVD is 1 Torr. This pressure is lower than the pressure (2.0 Torr) in the chamber during the plasma enhanced CVD under the low pressure.

Figure 3I:
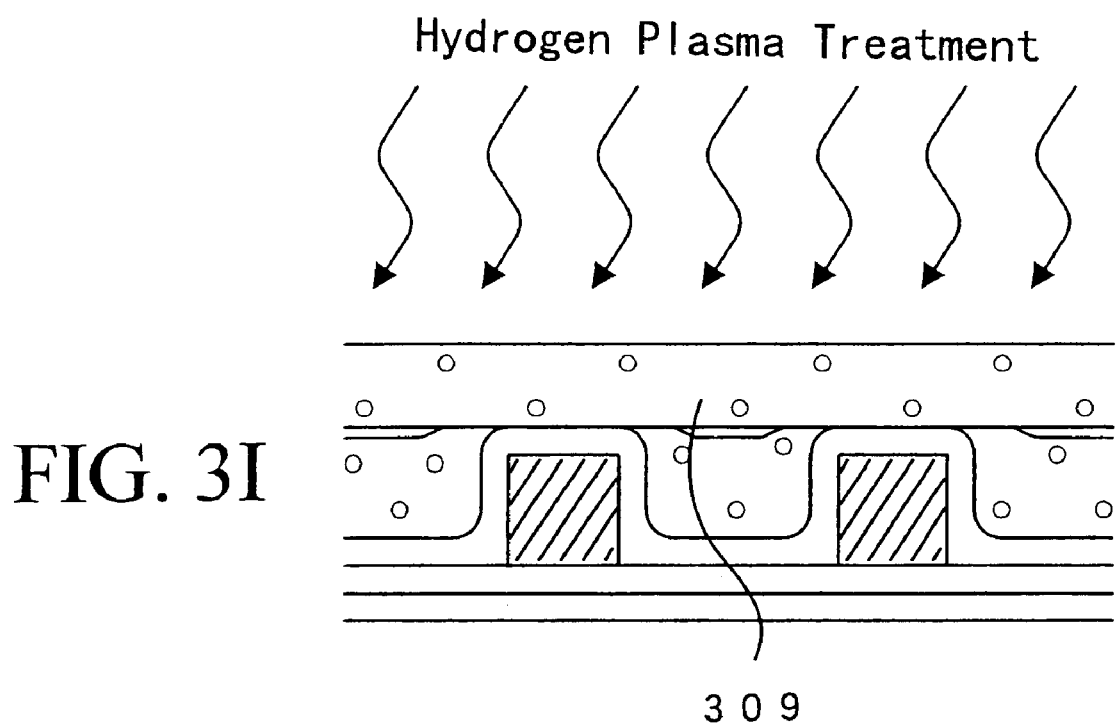

Then, as shown in FIG. 3I, the porous $SiO_2$ film 309 is subjected to the H (hydrogen) plasma treatment. Thus, the dangling bond in the Si—O bond on the inner surface of the voids is replaced by the Si—H bond. Therefore, the film improves in the moisture absorption resistance.

The interlayer insulating film having the good heat resistivity and moisture absorption resistance and the low dielectric constant is forced on the substrate 304 with the $SiO_2$ films 305 (the underlying insulating film), 306, 307 and 309 which are formed as described above. That is, the SiO$_2$ films 306 and 309 are porous and thus the dielectric constant of the SiO$_2$ films 306 and 309 is 2.0 to 3.0. These values are lower than the dielectric constant 4.0 of the typical nonporous SiO$_2$ film. Moreover, the porous SiO$_2$ films 306 and 309 are subjected to the H (hydrogen) plasma treatment, whereby the film improves in the moisture absorption resistance. Additionally, the heat resistivity of the SiO$_2$ films 305, 306, 307 and 309 is better than that of the organic insulating film.

In the aforementioned example, SiH$_4$ and O$_2$ are used as the reaction gas for forming the porous SiO$_2$ films 306 and 309. However, other reaction gases can be used to form the similar film. Such reaction gases are as follows:

SiH compound+O$_2$,
SiH compound+O$_3$+O$_2$,
Si—C—O—H compound+O$_2$, or
Si—C—O—H compound+O$_3$+O$_2$.

In the above compounds such as the SiH compound and Si—C—O—H compound, a general formula Si$_n$H$_{2n+2}$ (n=1 to 2) may be used as the SiH compound. A general formula Si(OR)$_n$H$_{4-n}$ (R=C$_m$H$_{2m+1}$ (m=1, 2), n=1 to 4) may be used as the Si—C—O—H compound.

Those are the same in the following embodiment.

(d) Fourth embodiment

The fourth embodiment is obtained by applying the third embodiment to the damascene process.

FIGS. 5A to 5M are cross-sectional views for describing the fourth embodiment. FIG. 4 is the graph showing the time dependency of the SiH$_4$ flow rate, the O$_2$ flow rate, the Ar flow rate and the RF power applied to the chamber in the fourth embodiment.

Figure 5A:
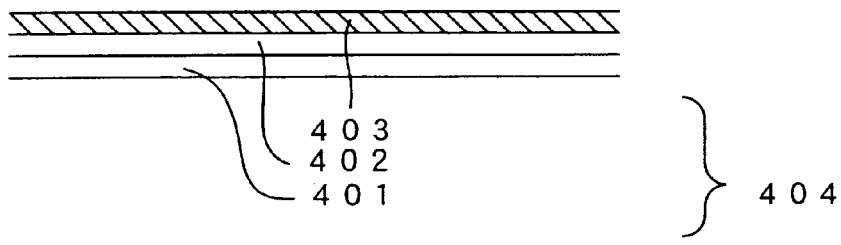
FIGS. 5A to 5M are cross-sectional views showing the method for forming the interlayer insulating film according to the fourth embodiment of the present invention.

First, as shown in FIG. 5A, a BPSG (borophosphosilicate glass) film 402 is formed on a silicon substrate 401. An aluminum layer is formed on the BPSG film 402 and then the aluminum layer is patterned, whereby an aluminum wiring layer 403 is formed. A substrate 404 comprises the silicon substrate 401, the BPSG film 402 and the aluminum wiring layer 403.

Figure 5B:
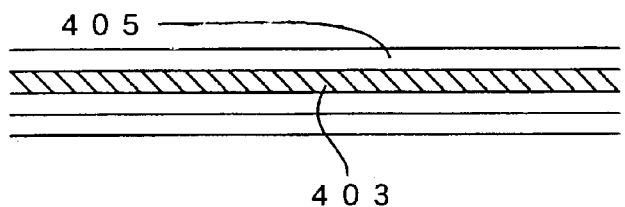

Then, as shown in FIG. 5B, an SiO$_2$ film 405 (the underlying insulating film) of 100 nm thick is formed on the aluminum wiring layer 403. This SiO$_2$ film 405 is formed by the low pressure CVD method using SiH$_4$ and O$_2$ as the reaction gas under a pressure of 1 Torr with the silicon substrate 401 kept at 400° C.

Figure 5C:
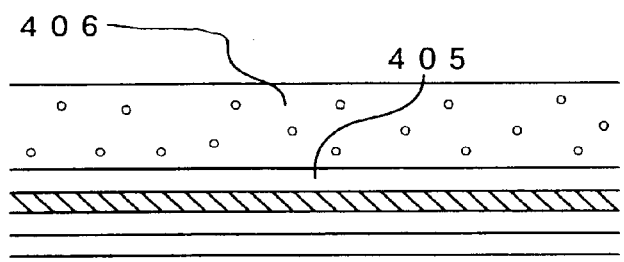

Subsequently, as shown in FIG. 5C, a porous SiO$_2$ film 406 is formed on the SiO$_2$ film 405 (the underlying insulating film). This SiO$_2$ film 406 is formed by applying the RF power shown in FIG. 4 to the chamber using SiH$_4$ and O$_2$ as the reaction gas with the silicon substrate 401 kept at 400° C. As can be seen from FIG. 4, during the film formation, the SiH$_4$ flow rate and the O$_2$ flow rate are fixed, whereas the RF power is applied to the chamber at a cycle of 10 sec. Thus, the plasma is generated and disappears at every cycle of 10 sec. While the plasma is generated, Ar is introduced into the chamber in order to control the pressure in the chamber. The use of the plasma changing with the time permits the process using the low pressure CVD and the process using the plasma enhanced CVD under the low pressure to repeat in one chamber. For instance, in FIG. 4, the plasma is not generated during the time period from 0 sec to 5 sec, and thus the process using the low pressure CVD is performed. The plasma is generated during the time period from 5 sec to 10 sec, and thus the process using the plasma enhanced CVD under the low pressure is performed. In this embodiment, the pressure in the chamber during the low pressure CVD is 1 Torr. This pressure is lower than the pressure in the chamber during the plasma enhanced CVD under the low pressure. Moreover, the RF power with a frequency of 13.56 MHz and the RF power with a frequency of 400 kHz are used in order to generate the plasma. The low pressure CVD and the plasma enhanced CVD under the low pressure are repeated an this way, whereby the SiO$_2$ film having many voids is formed. That is, the SiO2 film 406 is porous. The SiO$_2$ film 406 has a thickness of 300 nm.

Figure 5D:
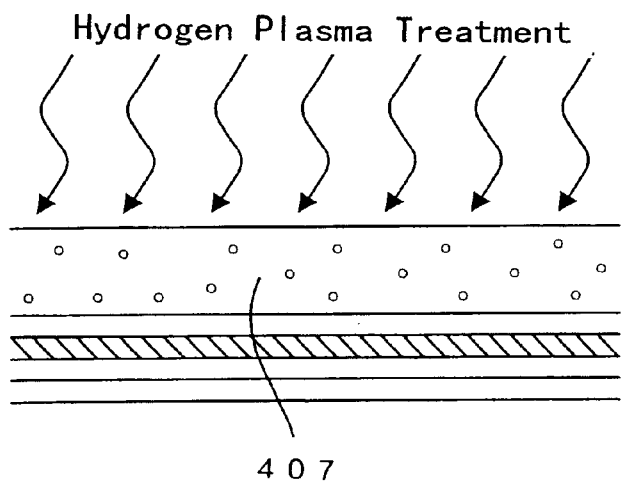

Then, as shown in FIG. 5D, the porous SiO$_2$ film 406 is subjected to the H (hydrogen) plasma treatment. Thus, the dangling bond in the Si—O bond on the inner surface of the voids is replaced by the Si—H bond. Therefore, the film improves in the moisture absorption resistance.

Figure 5E:
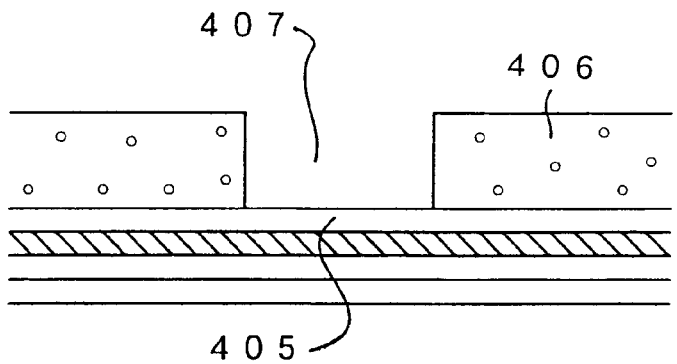

Subsequently, as shown in FIG. 5E, the SiO$_2$ films 405 (the underlying insulating film) and 406 are opened by patterning, whereby a damascene trench 407 is formed. This damascene trench 407 communicates with to the aluminum wiring layer 403 formed under the SiO$_2$ film 405.

Figure 5F:
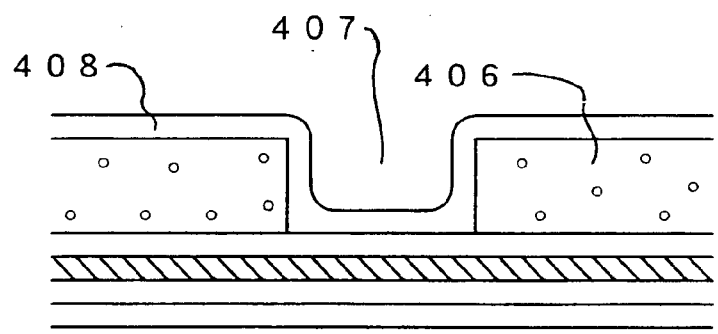

Next, as shown in FIG. 5F, an SiO$_2$ film 408 (the first insulating film) is formed on the SiO$_2$ film 406 and on the sides and the bottom of the damascene trench 407. This SiO$_2$ film 408 is formed by the plasma enhanced CVD method. The SiO$_2$ film 408 formed on the sides of the damascene trench 407 can prevent Cu to be later buried in the damascene trench 407 from diffusing into the porous SiO$_2$ film 406. The SiO$_2$ film 408 has a thickness of 100 nm.

Figure 5G:
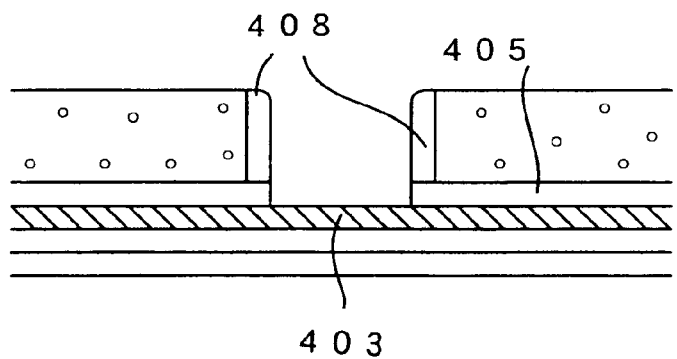

Next, as shown in FIG. 5G, the SiO$_2$ film 408 (the first insulating film) is anisotropically etched. Thus, the SiO$_2$ film 408 is removed leaving a portion of the SiO$_2$ film 408 formed on the sides of the damascene trench 407. Consequently, the contact hole communicating with the aluminum wiring layer 403 is formed in the bottom of the damascene trench 407.

Figure 5H:
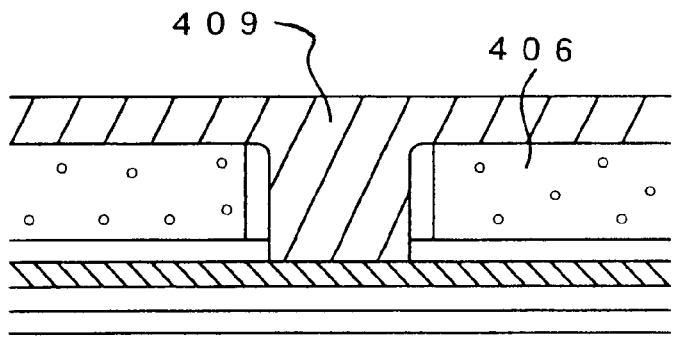

Subsequently, as shown in FIG. 5H, a Cu-plated film 409 is formed in the damascene trench 407 and on the SiO$_2$ film 406. The Cu-plated film 409 formed in the damascene trench 407 is used as the Cu wiring layer.

Figure 5I:
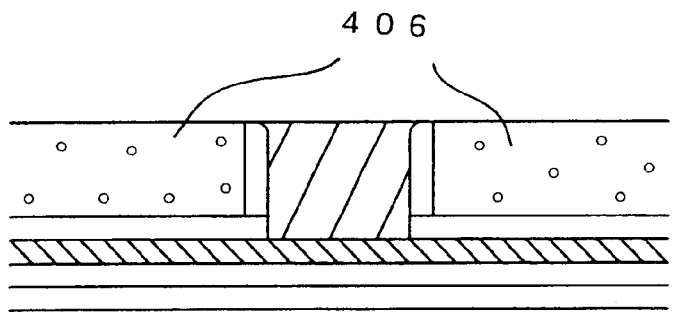

Next, as shown in FIG. 5I, the Cu-plated film 409 formed on the SiO$_2$ film 406 is polished and removed by the CMP method. Thus, the Cu-plated film remains only in the damascene trench 407.

Figure 5J:
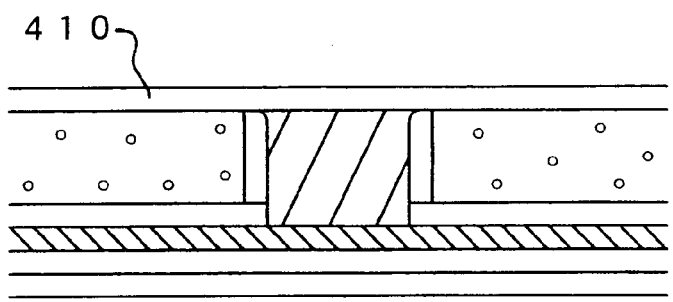

Then, as shown in FIG. 5J, a TiN film 410 for the barrier metal is formed on the damascene trench 407. This TiN film 410 can prevent Cu in the damascene trench 407 from diffusing into the SiO$_2$ film to be later formed on the damascene trench 407.

Figure 5K:
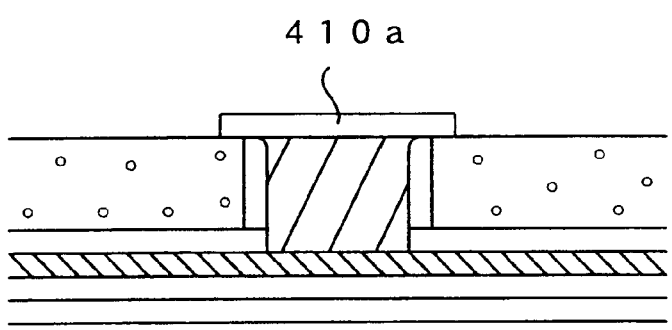

Then, as shown in FIG. 5K, the patterning leaves a TiN film 410a formed on the damascene trench 407 and etches away the TiN film 410 formed on the other portion.

Figure 5L:
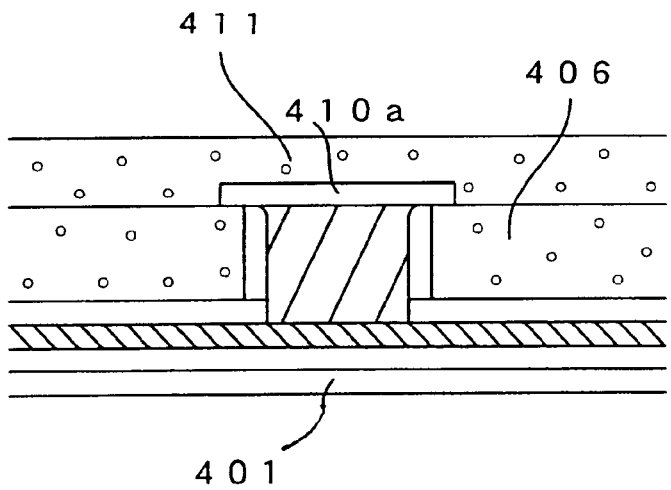

Then, as shown in FIG. 5L, a porous SiO$_2$ film 411 is formed on the SiO$_2$ film 406 and the TIN film 410a. This SiO$_2$ film 411 is formed by repeating the low pressure CVD and the plasma enhanced CVD similarly to the porous SiO$_2$ film 406 previously formed. That is, the SiO$_2$ film 411 is formed by applying the pulse plasma (the plasma which is periodically generated and disappears) shown in FIG. 4 in the atmosphere of Ar using SiH$_4$ and O$_2$ as the reaction gas with the silicon substrate 401 kept at 400° C . In this case, the RF power applied to generate the plasma has a frequency of 13.56 MHz. The pressure in the chamber during the low pressure CVD is 1 Torr. This pressure is lower than the pressure in the chamber during the plasma enhanced CVD under the low pressure. The SiO$_2$ film 411 has a thickness of 500 nm.

Figure 5M:
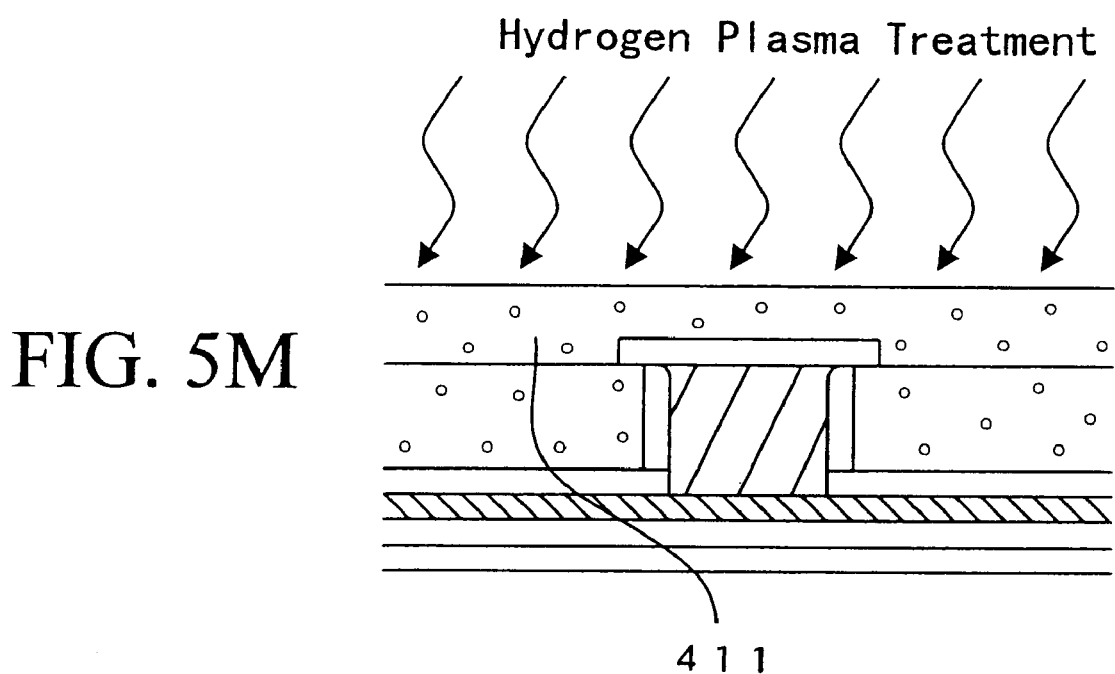

Then, as shown in FIG. 5M, the porous SiO$_2$ film 411 is subjected to the H (hydrogen) plasma treatment. Thus, the dangling bond in the Si—O bond on the inner surface of the voids is substituted with the Si—H bond. Therefore, the film improves in the moisture absorption resistance.

As described above, the interlayer insulating film having the good heat resistivity and moisture absorption resistance and the low dielectric constant is formed on the substrate 404. That is, the $SiO_2$ films 406 and 411 are porous and thus the dielectric constant of these films is 2.0 to 3.0. These values are lower than the dielectric constant 4.0 of the typical nonporous $SiO_2$ film. Moreover, the porous $SiO_2$ films 406 and 411 undergo the H (hydrogen) plasma treatment, whereby the film i;improves in the moisture absorption resistance. Furthermore, the heat resistivity of the $SiO_2$ films 406 and 411 is better than that of the organic insulating film.

In the above-described example, $SiH_4$ and $O_2$ are used as the reaction gas for forming the porous $SiO_2$ films 406 and 411. However, other reaction gases can be used to form the similar film. Such reaction gases are as follows:

SiH compound+$O_2$,
SiH compound+$O_3$,
Si—C—O—H compound+$O_2$, or
Si—C—O—H compound+$O_3$.

(e) Fifth embodiment

FIGS. 6A to 6J are cross sectional views for describing the fifth embodiment. FIG. 7 is a graph showing the time dependency of the flow rate of the reaction gas (a CH compound) for forming an organic film, the flow rate of the reaction gas ($SiH_4$) for forming the $SiO_2$ film, the $O_2$ flow rate and the gas (Ar) for controlling the pressure in the fifth embodiment.

Figure 6A:
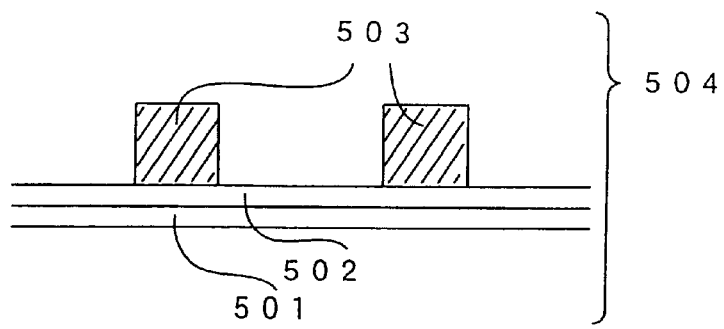

First, as shown in FIG. 6A, a BPSG (borophosphosilicate glass) film 502 is formed on a silicon substrate 501. An aluminum film is formed on the BPSG film 502 and then the aluminum film is patterned, whereby an aluminum wiring layer 503 is formed. A substrate 504 comprises the silicon substrate 501, the BPSG film 502 and the aluminum wiring layer 503 which are formed in this manner.

Figure 6B:
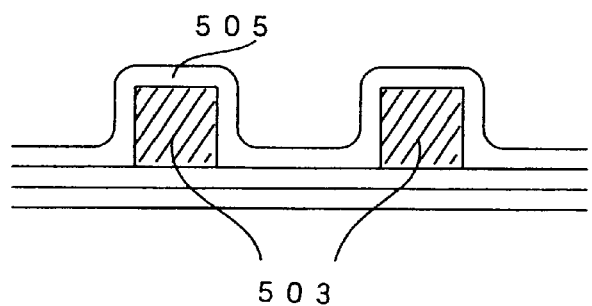

Then, as shown in FIG. 6B, an $SiO_2$ film 505 (the underlying insulating film) of 100 nm thick is formed on the aluminum wiring layer 503. This $SiO_2$ film 505 is formed by the low pressure CVD method using $SiH_4$ and $O_2$ as the reaction gas under a pressure of 1 Torr with the silicon substrate 501 kept at 400° C.

Figure 6C:
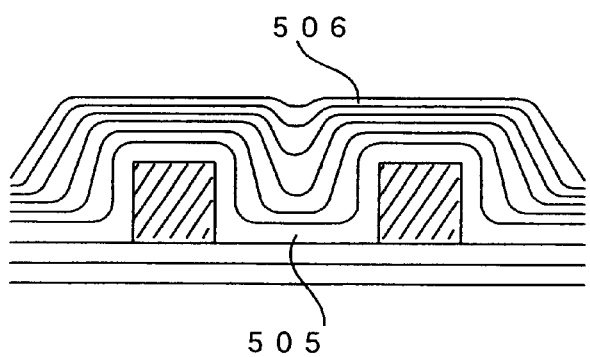

Then, as shown in FIG. 6C, a film 506 is formed on the $SiO_2$ film 505 by depositing the organic film and the $SiO_2$ film alternately. The film 506 having the organic film alternating with the $SiO_2$ film is formed by alternately introducing the reaction gas for forming the organic film and the reaction gas for forming the $SiO_2$ film into the chamber which the RF power with a frequency of 13.56 MHz and the PF power with a frequency of 400 kHz are applied to. The $SiO_2$ film is formed on the uppermost layer of the film 506. For example, in FIG. 7, the $SiO_2$ film is formed during the time period from 0 sec to 5 sec, and the organic film is formed during the time period from 5 sec to 10 sec. In this embodiment, TEOS (Tetra-Ethyl-Ortho-Silicate) or $Si(CH_3)H_3$ is used as the reaction gas for forming the organic film, and $SiH_4$ is used as the reaction gas for forming the $SiO_2$ film.

Figure 6D:
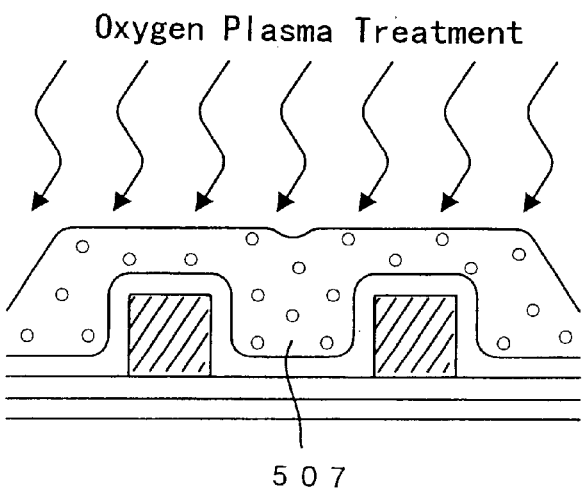

Then, as shown in FIG. 6D, the film 506 having the organic film alternating with the $SiO_2$ film is subjected to ashing by O (oxygen) plasma. Thus, the organic film is ashed, so that the voids are created in an area in which the organic film was formed. Consequently, the film 506 having the organic film alternating with the $SiO_2$ film is changed to a porous $SiO_2$ film 507.

Figure 6E:
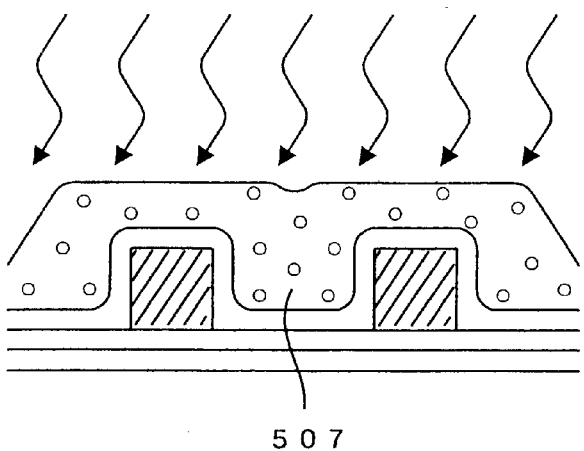

Subsequently, as shown in FIG. 6E, the porous $SiO_2$ film 507 is subjected to the H (hydrogen) plasma treatment. Thus, the dangling bond in the Si—O bond on the inner surface of the voids is substituted with the Si—H bond. Therefore, the film improves in the moisture absorption resistance.

Figure 6F:
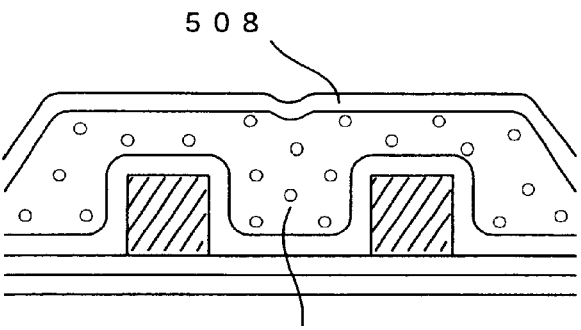

Then, as shown in FIG. 6F, an $SiO_2$ film 508 is formed on the porous $SiO_2$ film 507 subjected to the H (hydrogen) plasma treatment. This $SiO_2$ film 508 is formed by the low pressure CVD method. $SiH_4$ and $O_2$ are used as the reaction gas.

Figure 6G:
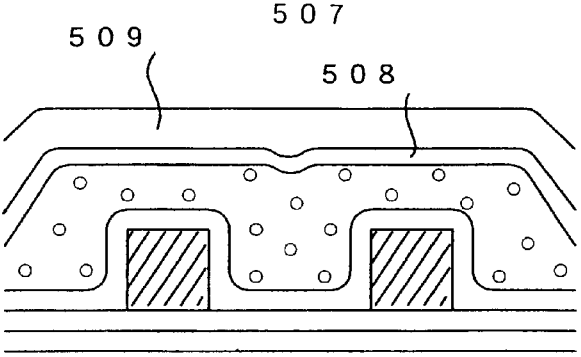

Then, as shown in FIG. 6G, an $SiO_2$ film 509 is formed on the $SiO_2$ film 508. This $SiO_2$ film 509 is formed in order to planarize the surface. The $SiO_2$ film 509 is formed by the CVD method using TEOS (Tetra-Ethyl-Ortho-Silicate) and $O_3$ as the reaction gas. The density of $O_3$ for use in this case is sufficient to oxidize TEOS. Thus, the $SiO_2$ film 509 is a fluidic $SiO_2$ film.

Figure 6H:
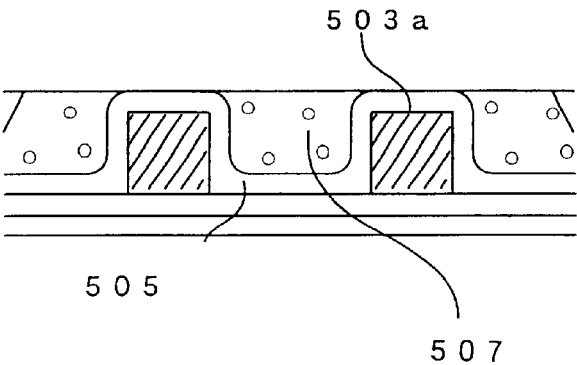

Subsequently, as shown in FIG. 6H, the surface of the $SiO_2$ film 509 is polished and planarized by the CMP method. At this time, the $SiO_2$ film (the underlying insulating film) 505, the porous $SiO_2$ film 507 and the $SiO_2$ film 508 previously formed are partly polished and removed. The planarizing by the CMP is such that the $SiO_2$ film 505 formed on a convexity 503a of the aluminum wiring layer is not completely removed.

Then, as shown in FIG. 6I, a porous $SiO_2$ film 510 is formed on the planarized surface. This $SiO_2$ film 510 is formed in the same manner as the porous $SiO_2$ film 507 previously formed. That is, the organic film and the $SiO_2$ film are alternately deposited by alternately introducing the reaction gas for forming the organic film and the reaction gas for forming the $SiO_2$ film into the chamber which the RF power with a frequency of 13.56 MHz and the RF power with a frequency of 400 kHz are applied to. Then, the obtained film is subjected to ashing by the O (oxygen) plasma. Thus, the organic film is ashed, so that the voids are created in the area in which the organic film was formed. As a result, the porous $SiO_2$ film 510 was formed. In this embodiment t, the CH containing compound is used as the reaction gas for forming the organic film, and $SiH_4$ and $O_2$ are used as the reaction gas for forming the $SiO_2$ film.

Subsequently, as shown in FIG. 6J, the porous $SiO_2$ film 510 is subjected to the H (hydrogen) plasma treatment. Thus, the dangling bond in the Si—O bond on the inner surface of the voids is substituted with the Si—H bond. Consequently, the film improves in the moisture absorption resistance.

The interlayer insulating film having the good heat resistivity and moisture absorption resistance and the low dielectric constant is formed on the substrate 504 with the $SiO_2$ films 505 (the underlying insulating film), 507, 508 and 510 which are formed as described above. That is, the $SiO_2$ films 507 and 510 are porous and thus the dielectric constant of these films is 2.0 to 3.0. These values are lower than the dielectric constant 4.0 of the typical nonporous $SiO_2$ film. Moreover, the porous $SiO_2$ films 507 and 510 undergo the H (hydrogen) plasma treatment, whereby the film improves in the moisture absorption resistance. Furthermore, the heat resistivity of the $SiO_2$ films 505, 507, 508 and 510 is better than that of the organic insulating film.

In the above-described example, the CH containing compound, $SiH_4$ and $O_2$ are used as the reaction gas which is alternately introduced into the chamber in order to form the porous $SiO_2$ films 507 and 510. However, the reaction gas for forming the porous $SiO_2$ film is not limited to these reaction gases. For example, a CF containing compound is used instead of $SiH_4$ of the above-mentioned reaction gases, whereby the porous F-containing $SiO_2$ film can be formed.

In the above compounds such as the CH compound and CF compound, a general formula $C_nH_{2n+2}$ (n=1 to 3) may be used as the CH compound. A general formula $F_nSi(OR)_{4-n}$ ($R=C_mH_{2m+1}$ (m=1, 2), n=1 to 4) of which $Fsi(OC_2H_5)_3$ is typical, or some compounds containing carbon and fluorine may be used as the CF compound.

Those are the same in the following embodiment.

Besides, in the above third to fifth embodiments, the cover insulating film 109 as shown in FIG. 1H may be formed in place of the porous insulating film 309, 411, 510.

Further, in the above first and second embodiments, the porous insulating film 309, 411, 510 in the above third to fifth embodiments may be formed in place of the cover insulating film 109.

(2) Description of a semiconductor manufacturing apparatus according to a sixth embodiment of the present invention The semiconductor manufacturing apparatus according to the sixth embodiment will be described with reference to FIGS. 4, 7 and 8.

Figure 8:
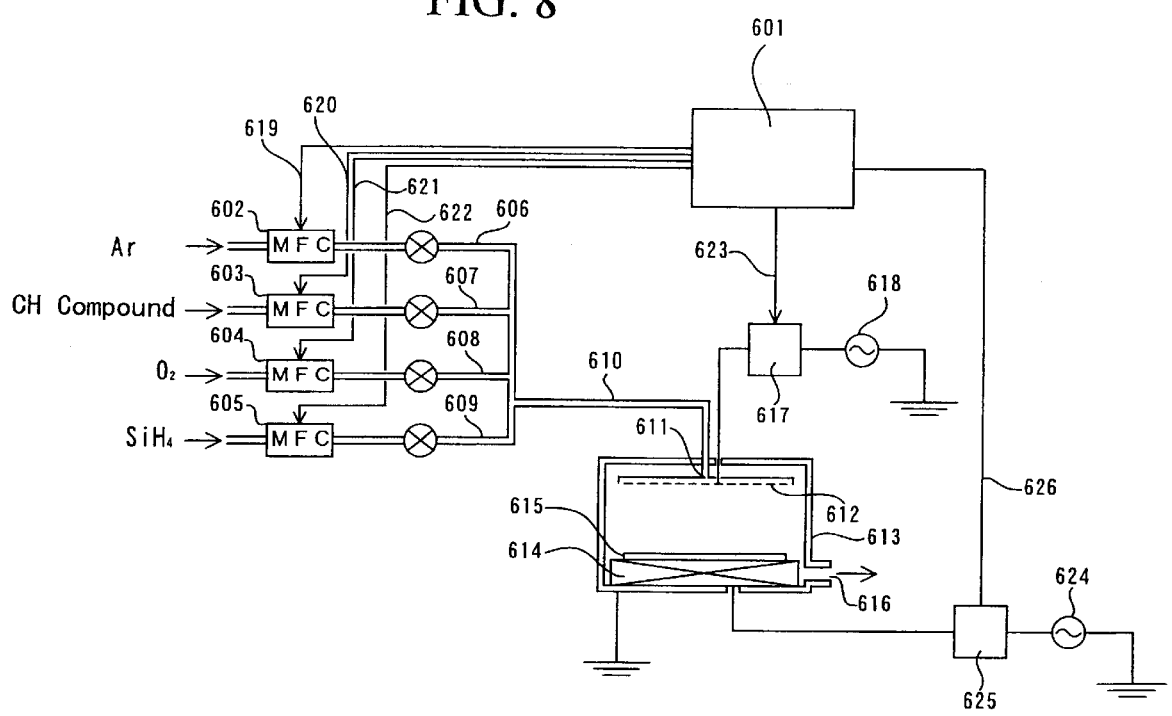
FIG. 8 shows a constitution of the semiconductor manufacturing apparatus according to the sixth embodiment of the present invention.

FIG. 8 shows a constitution of the semiconductor manufacturing apparatus according to the sixth embodiment. In this drawing, numeral 613 denotes the chamber for forming the film. Numeral 611 denotes a gas inlet for introducing the reaction gas into the chamber 613. Numeral 615 denotes a wafer. Numeral 612 denotes a gas emitter for uniformly dispersing the reaction gas onto the wafer 615. Numeral 614 denotes a wafer holder containing a heater. Numeral 616 denotes a gas outlet for exhausting the reaction gas out of the chamber 613.

Numeral 610 denotes a pipe connected to the gas inlet 611. Branch pipes 606, 607, 608 and 609 are connected to an upstream of the pipe 610. The branch pipe 606 is used to supply Ar (argon). The branch pipe 607 is used to supply the CH containing compound. The branch pipe 608 is used to supply $O_2$. The branch pipe 609 is used to supply $SiH_4$. Furthermore, MFCs (means for controlling the flow rate) are disposed between these branch pipes. Control signals 619, 620, 621 and 622 are inputted from control means 601 to the MFCs. The reaction gas is controlled by these control signals so that the reaction gas is supplied at a desired flow rate.

Numeral 618 denotes a high-frequency power generator for applying the RF power with a frequency of 13.56 MHz between the gas emitter 612 and the chamber 613. Numeral 617 denotes switching means for supplying the RF power generated by the high-frequency power generator 618 to the chamber.

Numeral 624 denotes the high-frequency power generator for applying the RF power with a frequency of 400 kHz between the substrate stand 614 and the chamber 613. Numeral 625 denotes the switching means for supplying the RF power generated by the high-frequency power generator 624 to the chamber 613.

Control signals 623 and 626 are inputted from the control means 601 to the switching means 617 and 625, respectively, so that the time of application of the RF power is controlled.

FIGS. 4 and 7 show the flow rate of the reaction gas and the time of application of the RF power which are controlled by the control means 601.

As shown in FIG. 4, during the film formation, MFC 602 (for supplying Ar), NFC 604 (for supplying $O_2$) and MFC 605 (for supplying $SiH_4$) keep open under the control signals 619, 621 and 622, and thus Ar, $O_2$ and $SiH_4$ are always introduced into the chamber. Since the reaction gas is always exhausted through the gas outlet 616, the chamber 613 is kept at the low pressure. During the time period from 5 sec to 10 sec, the switching means 617 and 625 are turned on by the control signals 623 and respectively, so that the RF power with a frequency of 13.56 MHz and the RF power with a frequency of 400 kHz are applied to the chamber 613. Thus, during the time period from 5 sec to 10 sec, the plasma enhanced CVD method under the low pressure is carried out in the atmosphere of Ar, $O_2$ and $SiH_4$.

On the other hand, in the drawing, during the time period from 10 sec to 15 sec, the switching means 617 and 625 are turned off and thus the RF power is not applied to the chamber Thus, the low pressure CVD method is performed in the atmosphere of $O_2$ and $SiH_4$. After 15 sec, the plasma enhanced CVD method under the low pressure and the low pressure CVD method are alternately repeated.

As described in the third and fourth embodiments, the plasma enhanced CVD method under the low pressure and the low pressure CVD method are thus repeated in the atmosphere of Ar, $O_2$ and $SiH_4$, whereby the porous $SiO_2$ film can be formed on the substrate.

FIG. 7 shows another example of the reaction gas flow rate which is controlled by the control means 601.

In this drawing, only the flow rate of the reaction gas is changed, and a level (not shown) of the RF power applied to the chamber is not changed. This is because the switching means 617 and 625 are always on under the control signals 623 and 626 during the film formation. The flow rates of $O_2$ and Ar change with time as shown in the drawing because the MFC 604 (for supplying $O_2$) and the MFC 602 (for supplying Ar) are controlled by the control signals 619 and 621.

During the time period from 5 sec to 10 sec in the drawing, MFC 603 (for supplying the CH containing compound) is opened by the control signal 620, so that the CH containing compound is introduced into the chamber 613 which the RF power is applied to. At the same time, the MFC 605 (for supplying $SiH_4$) is closed by the control signal 622. Thus, the atmosphere in the chamber is changed to the atmosphere of the CH containing compound and $O_2$, and the organic film is formed on the wafer 615 by the plasma enhanced CVD method.

On the other hand, during the time period from 10 sec to 15 sec in the drawing, the MFC 603 (for supplying the CH containing compound) is closed by the control signal 620, so that the introduction of the CH containing compound into the chamber is stopped. At the same time, the MFC 605 (for supplying $SiH_4$) is opened by the control signal 622. Thus, $SiH_4$ is introduced into the chamber 613 which the RF power is applied to. Then, the $SiO_2$ film is formed on the wafer 615 by the plasma enhanced CVD method in the atmosphere of $O_2$ and $SiH_4$. After 15 sec, the process for forming the organic film and the process for forming the $SiO_2$ film are alternately repeated, whereby the organic film and the $SiO_2$ film are alternately laminated on the wafer 615.

As described in the fifth embodiment, the film having the organic film alternating with the $SiO_2$ film is ashed by the O (oxygen) plasma so that the organic film is selectively removed, whereby the porous $SiO_2$ film can be formed on the substrate.

What is claimed is:

1. A method for forming an interlayer insulating film comprising the step of:
    forming a porous $SiO_2$ film on a substrate by chemical vapor deposition using a reaction gas containing an oxidative gas and a gas selected from the group consisting of $Si_2H_6$ and $Si_3H_8$.

2. A method according to claim 1, wherein said reaction gas further contains a compound containing an element selected from the group consisting of F (fluorine) and B (boron).

3. A method according to claim 1, wherein said oxidative gas is $O_2$ or $O_3$.

4. A method according to claim 1, wherein said porous $SiO_2$ film is formed, and then said porous $SiO_2$ film is subjected to a H (hydrogen) plasma treatment.

5. A method according to claim 1, wherein said porous $SiO_2$ film is formed, and then a cover insulating film is formed on said porous $SiO_2$ film.

6. A method according to claim 1, further comprising the steps of:

forming a damascene trench in said porous $SiO_2$ film by patterning;

forming a side wall insulating film on sides of said damascene trench;

embedding a metal film in said damascene trench; and forming a barrier metal layer on said metal film.

7. A method according to claim 1, wherein an underlying insulating film is formed on said substrate and then said porous $SiO_2$ film is formed on said underlying insulating film.

8. A method according to claim 1 wherein porous $SiO_2$ film is formed with a dielectric constant of 2.0 to 3.0.

* * * * *

UNITED STATES PATENT AND TRADEMARK OFFICE
CERTIFICATE OF CORRECTION

PATENT NO.    : 6,372,670 B1
DATED         : April 16, 2002
INVENTOR(S)   : Maeda It is certified that error appears in the above-identified patent and that said Letters Patent is hereby corrected as shown below:

Column 2,
Line 20, "SiLOF" should read -- SiOF --.

Column 3,
Line 58, "c" should read -- chamber --.

Column 8,
Line 37, "TEDS" should read -- TEOS --.

Column 10,
Line 8, "SiO2" should read -- $SiO_2$ --.

Column 11,
Line 12, "i;improves" should read -- improves --; and
Line 52, "PF" should read -- RF --.

Column 12,
Line 39, "embodiment t" should read -- embodiment --.

Column 13,
Line 63, "NFC" should read -- MFC --.

Column 14,
Line 3, after "and" insert -- 626 --; and
Line 11, after "chamber" insert -- 613 --.

Signed and Sealed this

Twenty-second Day of October, 2002

Attest:

Attesting Officer

JAMES E. ROGAN
*Director of the United States Patent and Trademark Office*